(12) United States Patent
Motohara et al.

(10) Patent No.: US 7,876,573 B2
(45) Date of Patent: Jan. 25, 2011

(54) STACKED MOUNTING STRUCTURE

(75) Inventors: Hiroyuki Motohara, Hachioji (JP); You Kondoh, Yamato (JP); Mikio Nakamura, Hinode-machi (JP); Takanori Sekido, Chofu (JP); Shinji Yasunaga, Asaka (JP)

(73) Assignee: Olympus Corporation, Tokyo (JP)

( * ) Notice: Subject to any disclaimer, the term of this patent is extended or adjusted under 35 U.S.C. 154(b) by 875 days.

(21) Appl. No.: 11/784,736

(22) Filed: Apr. 9, 2007

(65) Prior Publication Data

US 2007/0279890 A1    Dec. 6, 2007

(30) Foreign Application Priority Data

Apr. 28, 2006   (JP)   ............................. 2006-125078
Feb. 5, 2007    (JP)   ............................. 2007-025367

(51) Int. Cl.
*H01R 12/16*   (2006.01)
(52) U.S. Cl. .................. 361/790; 361/770; 361/803
(58) Field of Classification Search ......... 361/770–774, 361/790, 803
See application file for complete search history.

(56) References Cited

U.S. PATENT DOCUMENTS

| | | | | | |
|---|---|---|---|---|---|
| 5,140,745 | A | * | 8/1992 | McKenzie, Jr. .............. | 29/852 |
| 5,966,052 | A | * | 10/1999 | Sakai .......................... | 331/68 |
| 6,278,178 | B1 | * | 8/2001 | Kwon et al. ................. | 257/684 |
| 6,381,141 | B2 | * | 4/2002 | Corisis et al. ............... | 361/735 |
| 6,534,726 | B1 | * | 3/2003 | Okada et al. ................ | 174/263 |

FOREIGN PATENT DOCUMENTS

JP      2004-303884     10/2004

\* cited by examiner

*Primary Examiner*—Tuan T Dinh
(74) *Attorney, Agent, or Firm*—Scully, Scott, Murphy & Presser, P.C.

(57) ABSTRACT

A stacked mounting structure includes a first substrate, a second substrate, and an intermediate substrate which has a space accommodating therein components to be mounted. A first contact (connecting) terminal and a second contact (connecting) terminal are formed on the first substrate and the second substrate, and have a wire which is formed on a side surface of the intermediate substrate. By formation of the intermediate substrate to be on an inner side than an edge surface of the substrates, a part of the two contact terminals respectively are exposed. One end of the wire is connected to an exposed portion of the first contact terminal, and the other end of the wire is connected to an exposed portion of the second contact terminal.

5 Claims, 31 Drawing Sheets

STACKED MOUNTING STRUCTURE

CROSS-REFERENCE TO RELATED APPLICATION

The present application is based upon and claims the benefit of priority from the prior Japanese Patent Application Nos. 2006-125078 filed on Apr. 28, 2006 and 2007-25367 filed on Feb. 5, 2007; the entire contents of which are incorporated herein by reference

BACKGROUND OF THE INVENTION

1. Field of the Invention

The present invention relates to a stacked mounting structure, and particularly to a three-dimensional stacked mounting structure which is made by stacking a plurality of members in a direction of thickness of the members, and a method of manufacturing the stacked mounting structure.

2. Description of the Related Art

A technology related to a manufacturing method of a three-dimensional mounting module which includes a process of connecting semiconductor chips by stacking has hitherto been proposed (refer to Japanese Patent Application Laid-open Publication No. 2004-303884 for example). In the conventional technology, as shown in FIG. 30, a terminal 3 is formed at a peripheral portion of a surface of each semiconductor chip 1, on a side opposite to a substrate. Moreover, a wire 5 is formed by dripping a liquid which includes electroconductive fine particles by an ink-jet method, on a side surface 1b of the semiconductor chip 1 stacked by an adhesive layer 4. The terminals 3 of the stacked semiconductor chips 1 are connected by the wire 5.

However, when the terminals are formed by the ink-jet method such that the terminals are not protruded with respect to the side surface of the semiconductor chip, it is difficult to connect the terminals assuredly. Moreover, there is a problem that a contact resistance is increased.

When an attempt is made to decrease the contact resistance by connecting assuredly the terminals 3 which are provided on the peripheral portion of the semiconductor chip 1 by the ink-jet method, the terminals 3 are required to be formed continuously up to the side surface of the semiconductor chip 1. When the terminals 3 are drawn up to the side surface of the semiconductor chip 1 in such manner, it results in a decrease in productivity.

Furthermore, as shown in FIG. 31, a dimension b of a module becomes more than a dimension a of the semiconductor chip 1, by an amount of thickness of the wire. Therefore, there is an increase in a size of the stacked mounting structure.

SUMMARY OF THE INVENTION

The present invention is made in view of the abovementioned issues, and an object of the present invention is to connect assuredly terminals which are provided between members on which components to be mounted are mounted, and to provide a small-size stacked mounting structure.

To solve the issues mentioned above, and to achieve the object, according to the present invention, there can be provided a stacked mounting structure which includes at least two members namely a first member on which, components to be mounted are mounted, and a second member which is disposed facing the first member, and on which, other components to be mounted are mounted, and an intermediate member which is disposed between the first member and the second member, and which connects the first member and the second member by leaving a predetermined gap between the first member and the second member, and which has a space which accommodates therein the components to be mounted.

At least a pair of a first electrode and a second electrode is formed on the first member and the second member.

The stacked mounting structure further includes an electroconductive portion which is formed on a surface of the intermediate member orthogonal to a surface on which the first electrode and the second electrode are formed, and which electrically connects the first electrode and the second electrode.

A part of the first electrode and the second electrode respectively are exposed by at least a part of the intermediate member being formed to be on an inner side than (of) an edge surface of the first member and an edge surface of the second member.

One end of the electroconductive portion is connected to an exposed portion of the first electrode, and the other end of the electroconductive portion is connected to an exposed portion of the second electrode.

According to a preferable aspect of the present invention, it is desirable that each of the first electrode of the first member and the second electrode of the second member is exposed by formation of a concave portion in the surface of the intermediate member, orthogonal to the surface on which the first electrode or the second electrode is formed.

According to another preferable aspect of the present invention, it is desirable that the concave portion formed in the intermediate member has a first concave portion near the first member and a second concave portion near the second member.

According to still another preferable aspect of the present invention, it is desirable that the concave portion formed in the intermediate member has a structure such that one end reaches the first member and the other end reaches the second member, and at least a groove depth of a part of the concave portion structure is more than a groove depth of the remaining portion of the concave portion.

According to still another preferable aspect of the present invention, it is desirable that the concave portion formed in the intermediate member is filled with the electroconductive portion and an insulating member.

According to still another preferable aspect of the present invention, it is desirable that at least a part of the first electrode provided on the first member, and the second electrode which is provided on the second member and is facing the first electrode, are connected by the electroconductive portion of the intermediate member.

According to still another preferable aspect of the present invention, it is desirable that the electroconductive portion of the intermediate member includes an insulating portion, and at least a first electroconductive portion and a second electroconductive portion, and at least a part of the first electroconductive portion intersects the second electroconductive portion via the insulating portion.

According to still another preferable aspect of the present invention, it is desirable that each of the edge surface of the first member and the edge surface of the second member is a cut surface of a substrate.

According to still another preferable aspect of the present invention, it is preferable that the electroconductive portion of the intermediate member is formed by dripping a liquid which includes electroconductive fine particles by an ink-jet method.

According to another invention there can be provided a method of manufacturing a stacked mounting structure including steps of mounting on a first substrate in which, a group of components to be mounted is mounted on a first substrate, mounting on a second substrate in which, a group of components to be mounted is mounted on a second substrate, forming an intermediate substrate in which, a cavity and a concave portion are formed in an intermediate substrate, joining in which, the first substrate, the intermediate substrate, and the second substrate are joined, and a stacked mounting structure substrate is formed, cutting out in which, a stacked mounting structure is cut out from the stacked mounting structure substrate, and forming an electroconductive portion in which, an electroconductive portion is formed on a side surface of the intermediate substrate of the stacked mounting structure which is cut out.

DETAILED DESCRIPTION OF THE INVENTION

Embodiments of a stacked mounting structure according to the present invention will be described below in detail by referring to the accompanying diagrams. However, the present invention is not restricted to these embodiments.

First Embodiment

Figure 1:
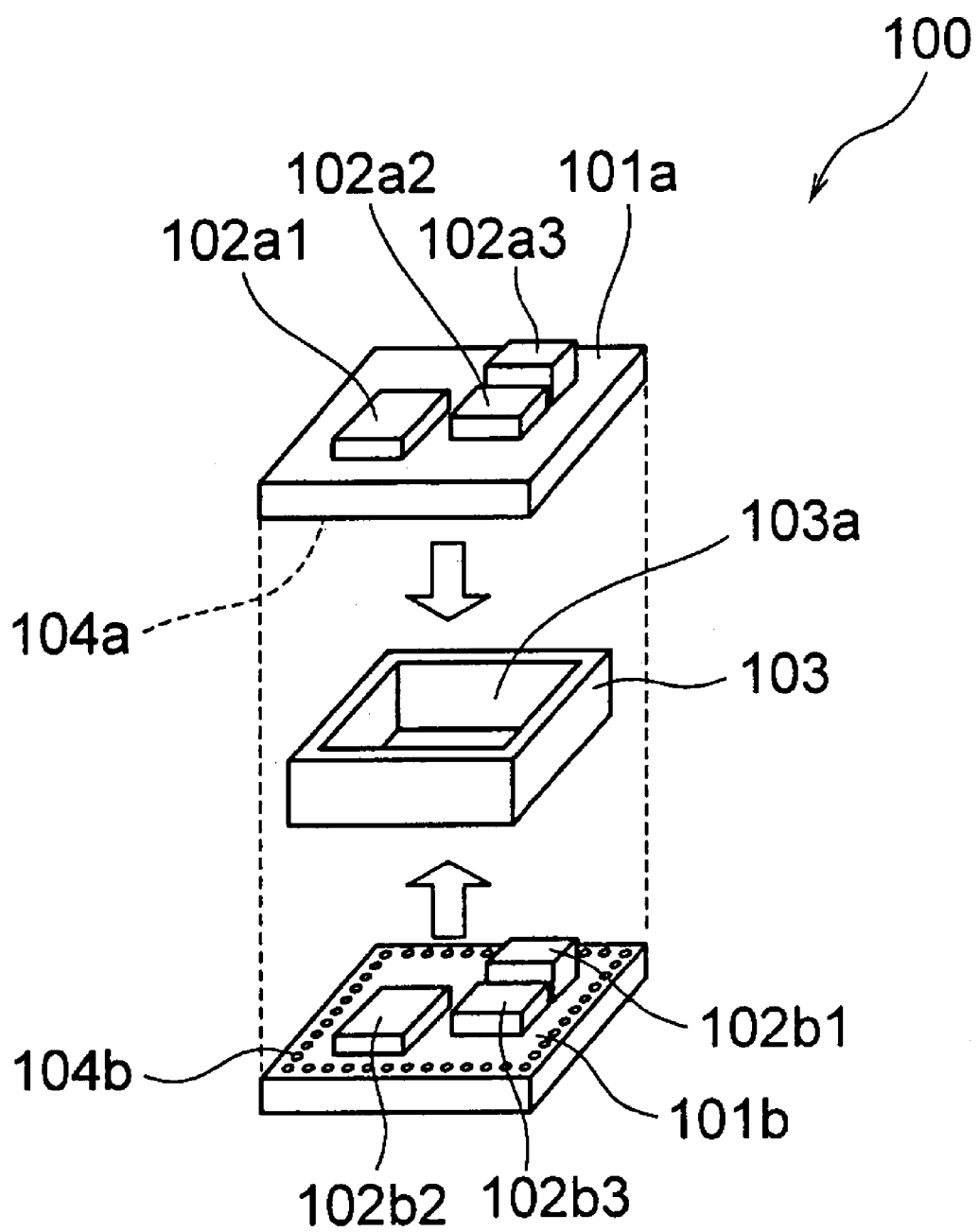
FIG. 1 is a diagram showing a perspective view of a state in which a stacked mounting structure according to a first embodiment of the present invention is disassembled.

FIG. 1 shows a perspective view of a state in which a stacked mounting structure 100 according to a first embodiment of the present invention is disassembled. Various devices 102a1, 102a2, and 102a3 (hereinafter called as "devices 102a1 etc.") which are electronic components including active components and passive components are mounted on a first substrate 101a. Moreover, various other devices 102b1, 102b2, and 102b3 (hereinafter called as "devices 102b1 etc.") which are electronic components including active components and passive components are mounted on a second substrate 101b. The first substrate 101a and the second substrate 101b are disposed to be facing mutually. The first substrate 101a corresponds to a first member. The second substrate 101b corresponds to a second substrate.

Each of the first substrate 101a, the second substrate 101b, and an intermediate substrate 103 which will be described later, is formed of a material such as an organic substrate, a ceramic substrate, and a glass substrate. Moreover, the first substrate 101a, the second substrate 101b, and the intermediate substrate 103 may be a composite substrate in which the respective substrates are combined.

Moreover, at least a pair of a first connecting terminal 104a and a second connecting terminal 104b is formed on the first substrate 101a and the second substrate 101b. The first connecting terminal 104a corresponds to a first electrode. The second connecting terminal 104b corresponds to a second electrode.

The first connecting terminal (not shown in FIG. 1) which is provided on the first substrate 101a is electrically connected to various devices 102a1 etc. mounted on the first substrate 101a. Moreover, the first connecting terminal 104a also has a function of connecting electrically the devices 102a1 etc. and the second substrate 101b.

Similarly, the second connecting terminal 104b which is provided on the second substrate 101b is electrically connected to various devices 102b1 etc. which are electronic components mounted on the second substrate 101b. Moreover, the second connecting terminal 104b also has a function of connecting electrically the devices 102b1 etc. and the first substrate 101a.

The intermediate substrate 103 is disposed between the first substrate 101a and the second substrate 101b. The intermediate substrate 103 connects the first substrate 101a and the second substrate 101b leaving a predetermined gap between the first substrate 101a and the second substrate 101b, and has an aperture 103a which is a space accommodating therein the devices 102b1 etc. which are components to be mounted.

Here, when the devices 102a1, 102b2, and 102b3 are mounted, use of a hardening-resin having fluidity, as a material for forming the intermediate substrate between the first substrate 101a and the second substrate 101b is also taken into consideration.

When a hardening-resin having fluidity is used, sometimes the intermediate substrate 103 is not formed uniformly on an entire area of the first substrate 101a and the second substrate 101b.

In contrast, in the first embodiment, not a hardening-resin having fluidity but an intermediate member in the form of a frame having the aperture 103a which is a space accommodating therein the devices 102b1, 102b2, and 102b3 is used as the intermediate substrate 103. Therefore, even when the devices 102b1, 102b2, and 102b3 mounted on the second substrate 102b are at comparatively higher position for example, it is possible to form the stacked structure.

Moreover, in an intermediate substrate in which a hardening-resin having fluidity is used, a step for exposing the first connecting terminal 104a provided on the first substrate 101a and the second connecting terminal 104b provided on the second substrate 101b, a step of grinding by a method such as a laser beam and an ablation for example, becomes necessary.

However, in the first embodiment, it is possible to form the intermediate substrate 103 in the form of a frame having the space accommodating the devices 102b1, 102b2, and 102b3 therein, such that the first connecting terminal 104a and the second connecting terminal 104b provided in advance on the first substrate 101a and the second substrate 101b are exposed. Therefore, it is possible to simplify the process.

Hereinafter, for the sake of convenience of description, a surface of the intermediate substrate 103 which is orthogonal to a surface on which the first connecting terminal 104a and the second connecting terminal 104b are formed will be called as a "side surface of the intermediate substrate 103".

The aperture 103a is formed in a side surface direction and a perpendicular direction of the intermediate substrate 103 by a method such as a drilling, a punching, a laser processing, an etching, and a die forming. Further, the structure is such that a height of the intermediate substrate 103 is same or more than a height of various devices 102b1 etc. mounted on the second substrate 101b.

Figure 2:
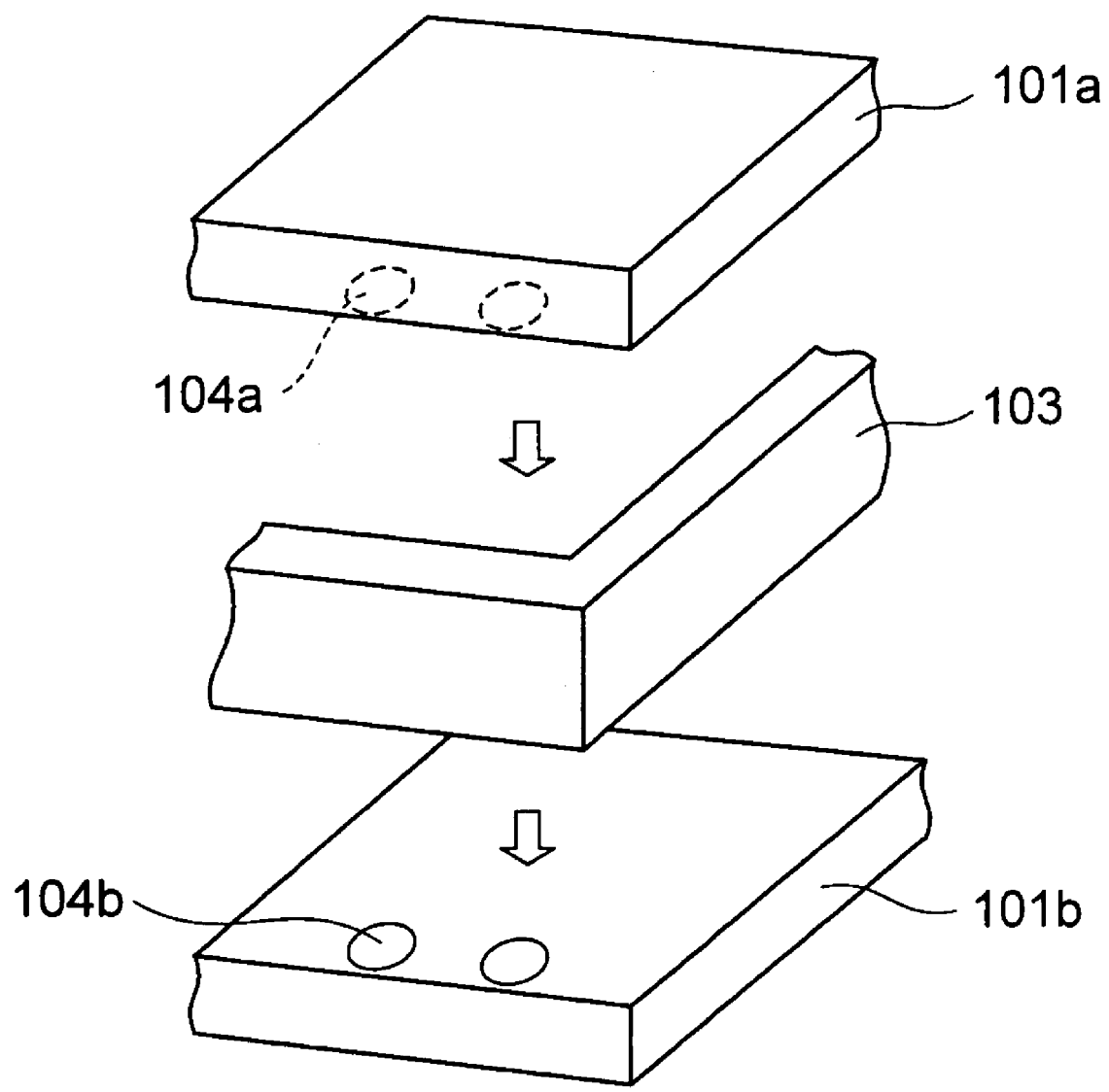
FIG. 2 is another diagram showing a perspective view of a state in which the stacked mounting structure according to the first embodiment is disassembled.
Figure 3:
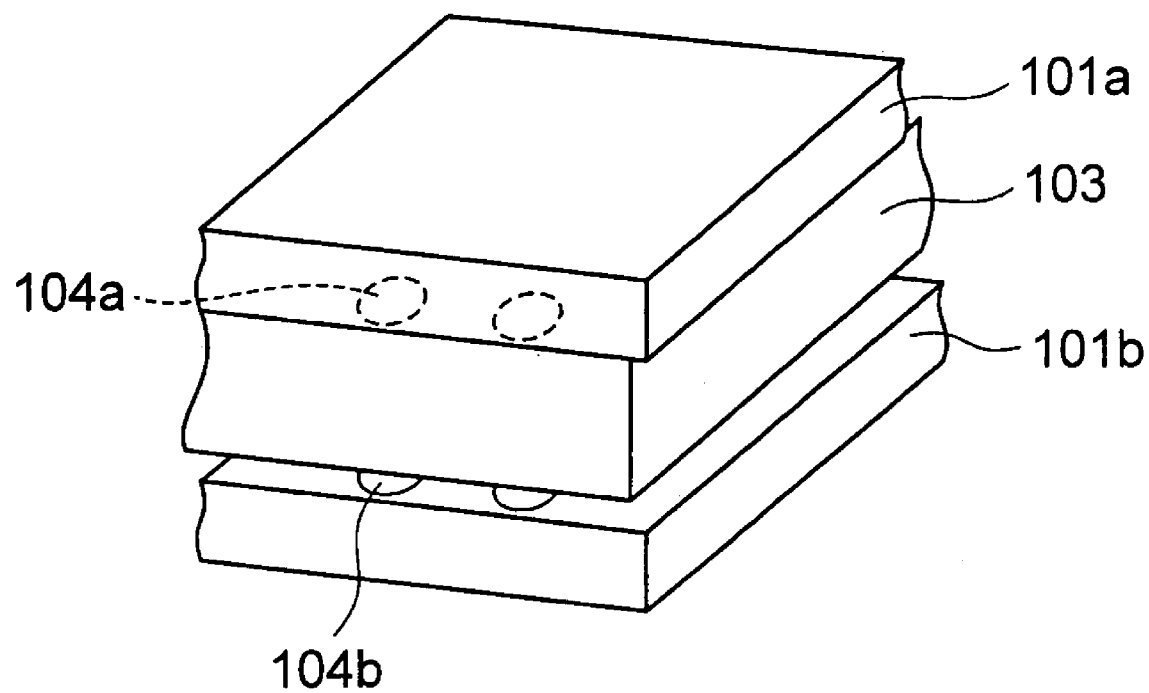
FIG. 3 is a diagram showing a perspective view of the stacked mounting structure according to the first embodiment.

Furthermore, at least a part of the side surface of the intermediate substrate 103 is formed to be on an inner side than an edge surface of each of the first substrate 101a and the second substrate 101b. FIG. 2 is another diagram which shows a state before joining the first substrate 101a, the second substrate 101b, and the intermediate substrate 103. FIG. 3 shows a state after the first substrate 101a, the second substrate 101b, and the intermediate substrate 103 are joined.

As shown in FIG. 2 and FIG. 3, the first substrate 101a on which various devices 102a1 etc. are mounted, and the second substrate 101b on which various devices 102b1 etc. are mounted are joined through the intermediate substrate 103, by a material such as an adhesive.

At the time of joining, as shown in FIG. 3, at least a part of the side surface of the intermediate substrate 103 is formed to be on the inner side than the edge surface of each of the first substrate 101a and the second substrate 101b. Therefore, each of the first connecting terminal 104a formed on the first substrate 101a and the second connecting terminal 104b formed on the second substrate 101b are exposed.

Figure 4:
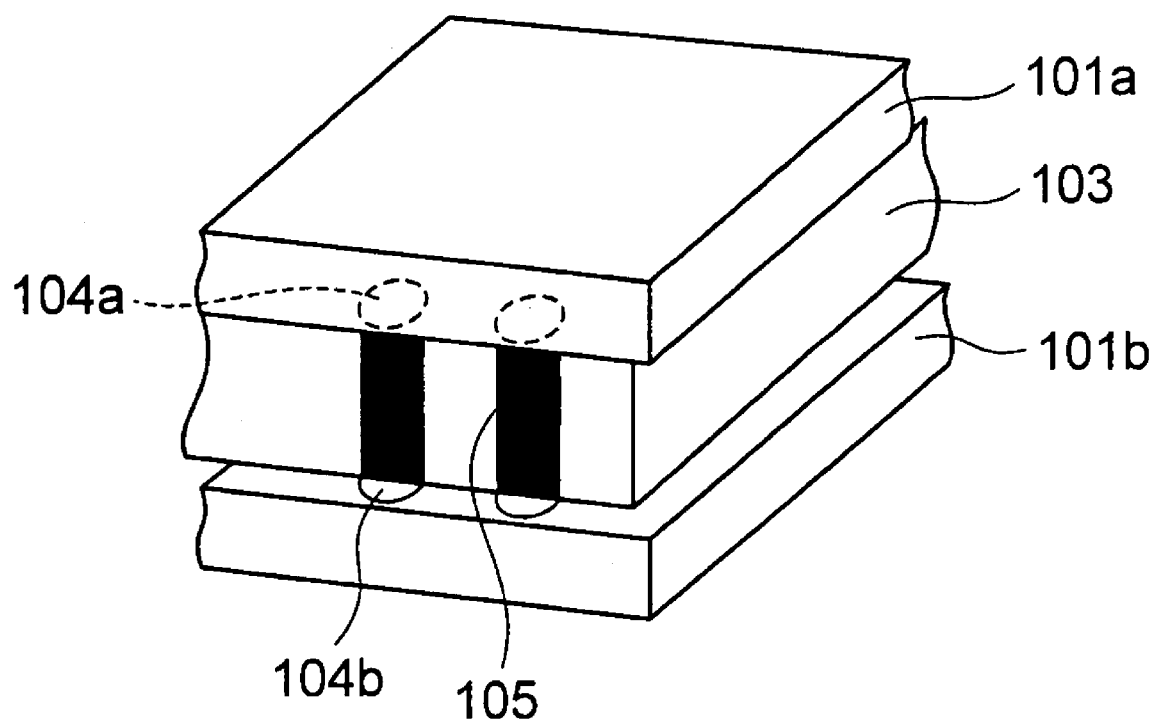
FIG. 4 is another diagram showing a perspective view of the stacked mounting structure according to the first embodiment.

Furthermore, as shown in FIG. 4, a wire 105 which electrically connects the first connecting terminal 104a or the second connecting terminal 104b is formed on a surface of the intermediate substrate 103, which is orthogonal to the surface on which the first connecting terminal 104a or the second connecting terminal 104b is formed, in other words on the side surface of the intermediate substrate 103. The wire 105 corresponds to an electroconductive portion. One end of the wire 105 is connected to an exposed portion of the first connecting terminal 104a. The other end of the wire 105 is connected to an exposed portion of the second connecting terminal 104b. The wire 105 is formed by a method such as a printing method, a thin-film wiring method, an ink-jet method, and a dispense method. For reinforcement of the wire, the wire 105 may be formed by using electroconductive particles and a nano paste such as a solder ball and an Au ball.

Figure 5A:
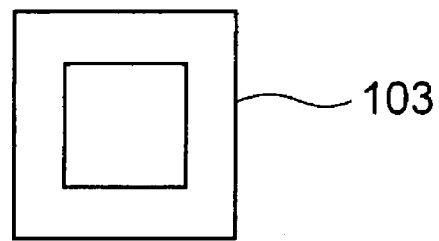
FIG. 5A, FIG. 5B, FIG. 5C, and FIG. 5D are diagrams showing modified examples of an intermediate substrate of the first embodiment.
Figure 5B:
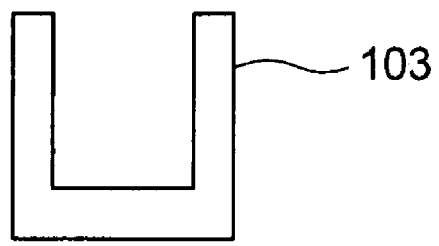
Figure 5C:
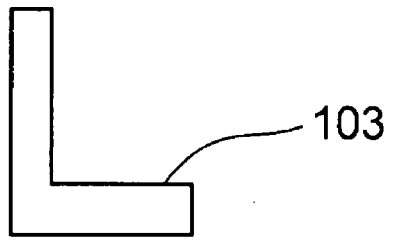
Figure 5D:
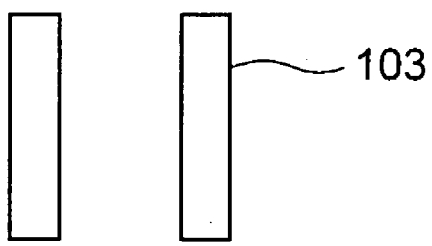

Each of FIG. 5A, FIG. 5B, FIG. 5C, and FIG. 5D shows an example of a shape of the intermediate substrate 103. The intermediate substrate 103, can be let to have a shape surrounded by a rectangular shape as shown in FIG. 5A, a shape of an English alphabet "U" as shown in FIG. 5B, a shape of an English alphabet "L" as shown in FIG. 5C, or a shape of two parallel plates as shown in FIG. 5D, when viewed from the top. Particularly, by letting the shape to be as shown in FIG. 5D, it is advantageous in further size reduction. In all the embodiments hereafter, by letting the shape to be of two parallel plates as shown in FIG. 5D, an effect that it is advantageous for the further size reduction is common.

Figure 6:
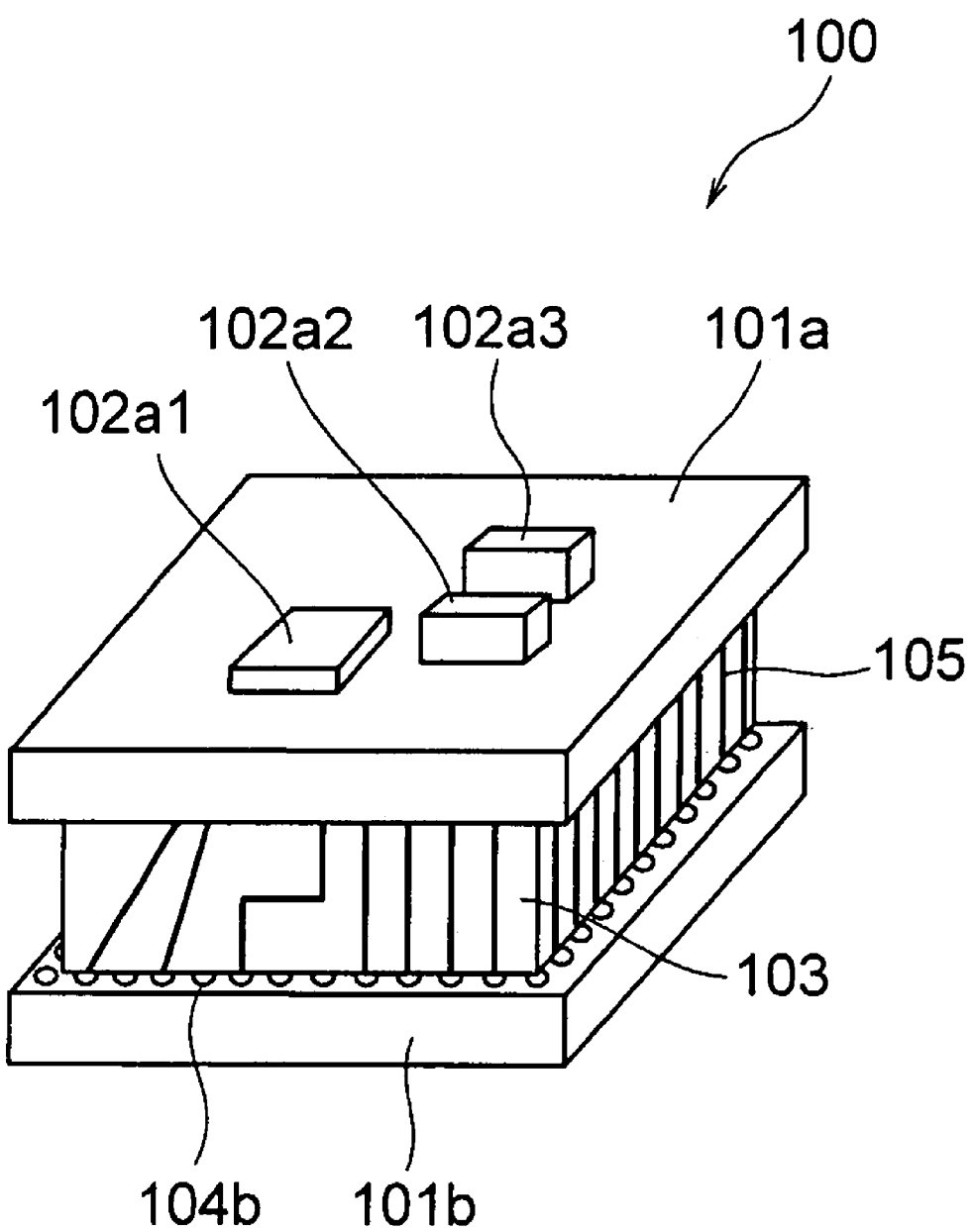
FIG. 6 is another diagram showing a perspective view of the stacked mounting structure according to the first embodiment.

FIG. 6 shows a perspective view of the stacked mounting structure 100 of the first embodiment. As shown in FIG. 6, any one connecting terminal from among a plurality of first connecting terminals 104a (not shown in FIG. 6) provided on the first substrate 101a is connected to any one connecting terminal from among a plurality of second connecting terminals 104b. In this manner, the wire 105 is not restricted to be structured to connect the first connecting terminal 104a and the second connecting terminal 104b which are close and facing mutually.

According to the first embodiment, at least a part of the side surface of the intermediate substrate 103 is formed to be on the inner side than the edge surface of each of the first substrate 101a and the second substrate 101b. Therefore, a part of the first connecting terminal 104a and the second connecting terminal 104b are exposed in a direction of a principal plane of the first connecting terminal 104a and the second connecting terminal 104b respectively. Accordingly, it is possible to increase a joining area of the connecting terminal of the first substrate 101a and the intermediate substrate 103, and the second substrate 101b and the intermediate substrate 103.

Moreover, in the first embodiment, the structure is such that the first connecting terminal 104a and the second connecting terminal 104b are exposed as described above. Therefore, it is possible to accommodate the wire 105 formed on the side surface of the intermediate substrate 103, in a projected image (projected area) when the first substrate 101a and the second substrate 101b are viewed from the top.

According to the first embodiment, it is possible to increase the joining area of the connecting terminal of the first substrate 101a and the intermediate substrate 103, and the second substrate 101b and the intermediate substrate 103. Therefore, it is possible to reduce a contact resistance. Consequently, it is possible to provide the stacked mounting structure 100 which is highly reliable electrically.

As it has been mentioned above, it is possible to accommodate the wire 105 formed on the side surface of the intermediate substrate 103, in the projected image (projected area) when the first substrate is viewed from the top.

It is possible to perform a mechanical connection between the first substrate 101a and the intermediate substrate 103, and a mechanical connection between the second substrate 101b and the intermediate electrode 103 not only by a wiring material, but also by a material such as an adhesive. Accordingly, it is possible to provide the stacked mounting structure 100 having a high strength even mechanically.

Second Embodiment

Figure 7:
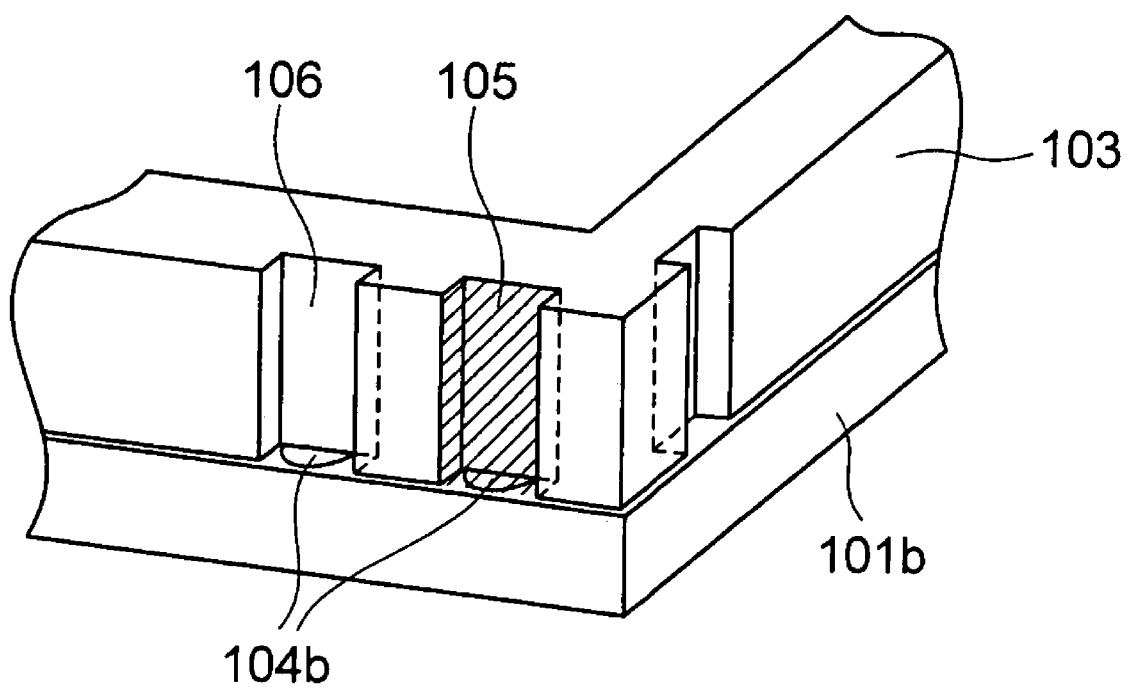
FIG. 7 is a diagram showing a perspective view of a stacked mounting structure according to a second embodiment of the present invention.
Figure 8:
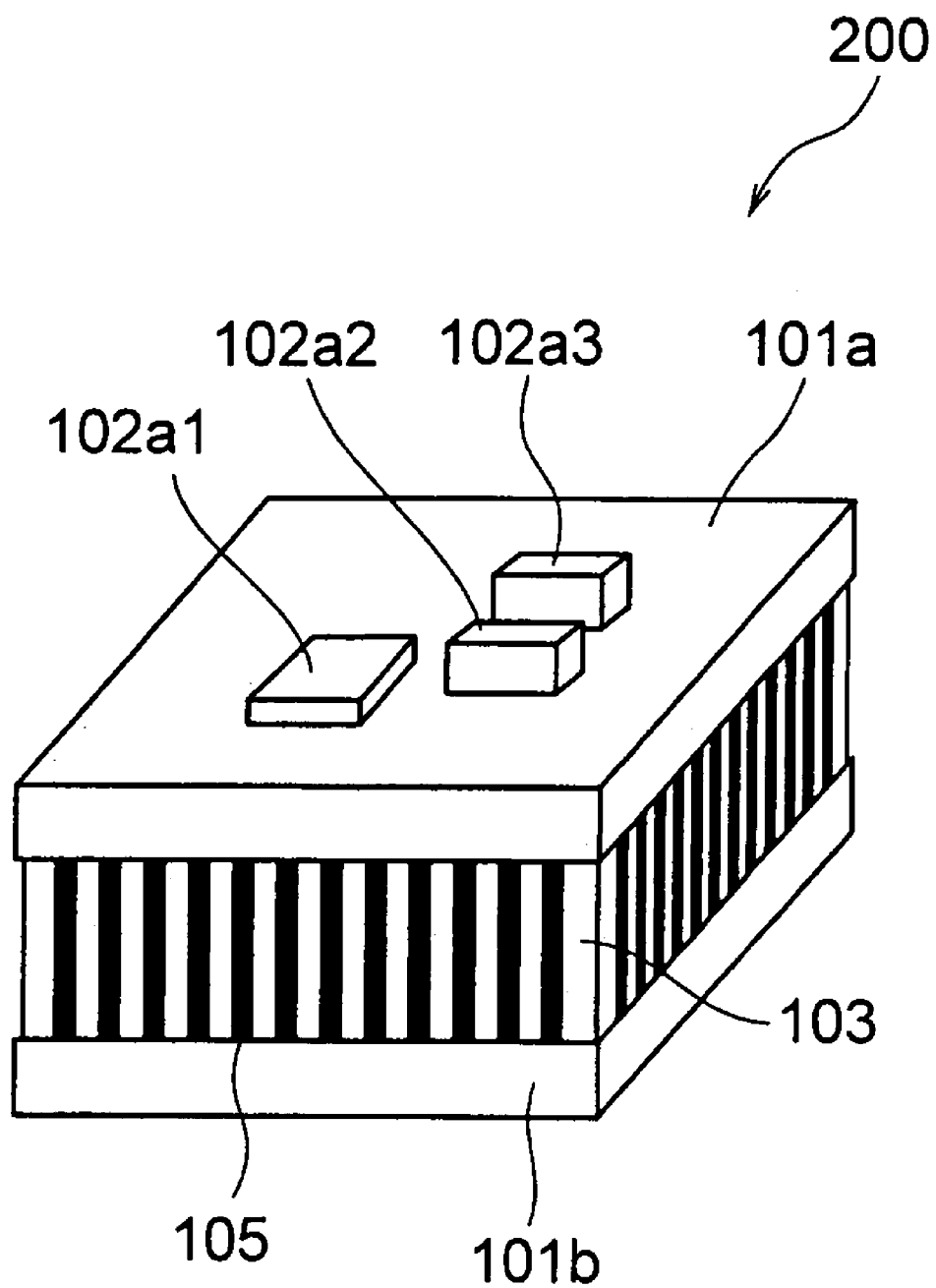
FIG. 8 is another diagram showing a perspective view of the stacked mounting structure according to the second embodiment.

Next, a stacked mounting structure 200 according to a second embodiment of the present invention will be described below. Same reference numerals are assigned to components which are same as in the first embodiment, and description to be repeated is omitted. FIG. 7 shows upon enlarging a structure near the intermediate substrate 103. Moreover, FIG. 8 shows a perspective view of the stacked mounting structure 200.

As shown in FIG. 7, in the second embodiment, a concave portion 106 is formed on the side surface of the intermediate substrate 103. Accordingly, the structure is such that the first connecting terminal 104a of the first substrate 101a and the second connecting terminal 104b of the second substrate 101b are exposed. The concave portion 106, as shown in FIG. 8, is formed spreading over a periphery of the intermediate substrate 103. Moreover, the concave portion 106 is formed continuously with a constant depth.

According to the second embodiment, the concave portion 106 is formed in at least a part of the side surface of the intermediate substrate 103. Therefore, a part of the first connecting terminal 104a and the second connecting terminal 104b respectively are exposed in a direction of a principal plane of the substrate. Accordingly, it is possible to increase the joining area of the connecting terminal of the first substrate 101a and the intermediate substrate 103, and the second substrate 101b and the intermediate substrate 103.

Moreover, the wire 105 is formed in the concave portion 106 by a method such as the printing method, the thin-film wiring method, the ink-jet method, and the dispense method. For the reinforcement of the wire, the wire 105 may be formed by using the electroconductive particles and the nano paste such as the solder ball and the Au ball. The first connecting terminal 104a formed on the first substrate 101a and the second connecting terminal 104b formed on the second substrate 101b are connected by the wire 105. Accordingly, it is possible to prevent the mutually adjacent wires 105 from interfering.

Figure 9:
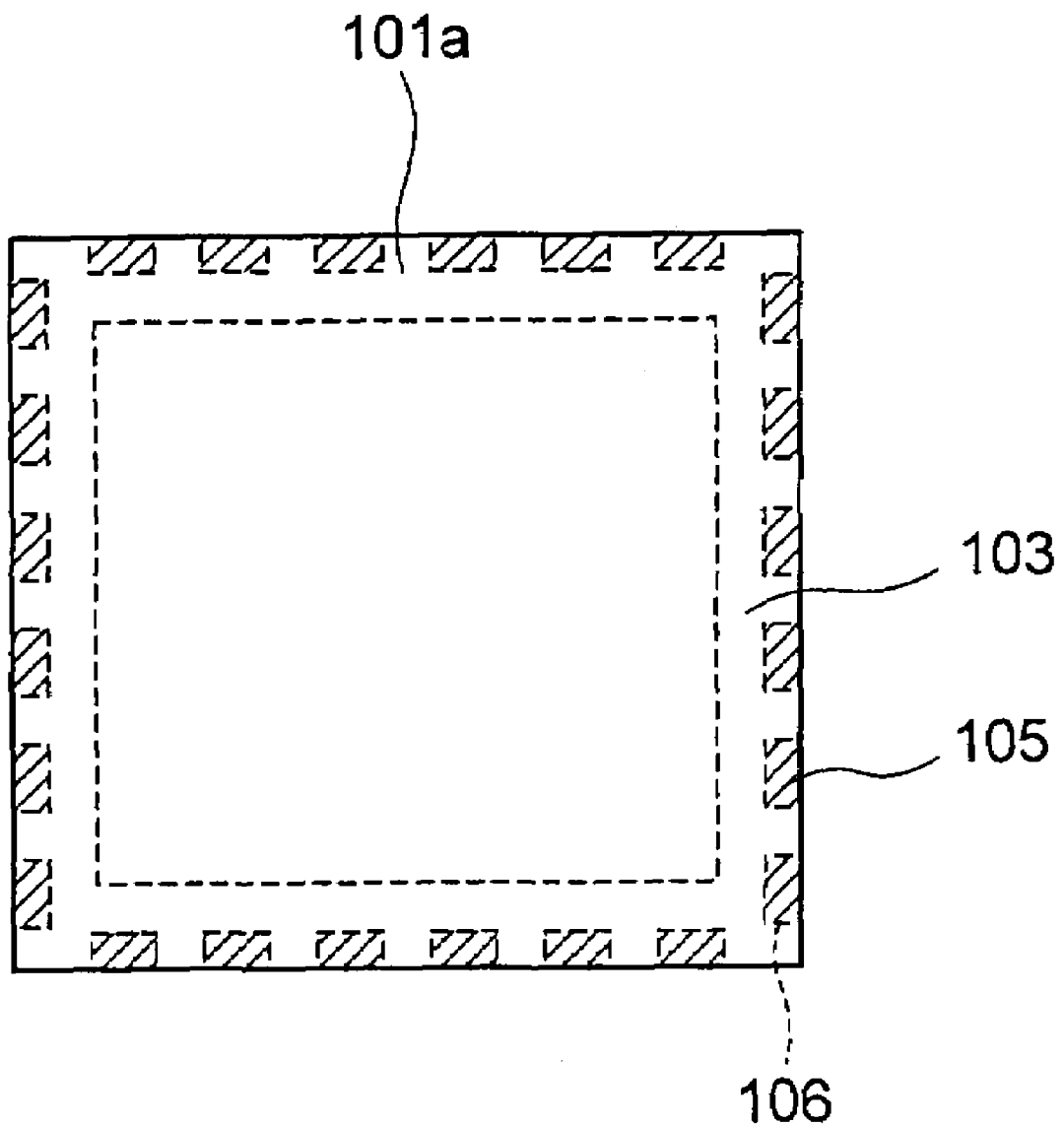
FIG. 9 is diagram of an intermediate substrate of the second embodiment, as viewed from a top.

Furthermore, at least a part of the side surface of the intermediate substrate 103 is formed to be on the inner side than the edge surface of each of the first substrate 101a and the second substrate 101b. Accordingly, the structure is such that each of the first connecting terminal 104a and the second connecting terminal 104b is exposed. Therefore, as shown in FIG. 9, it is possible to accommodate the wire 105 formed on the side surface of the intermediate substrate 103, in the projected image (projected area) when the first substrate 101a and the second substrate 101b are viewed from the top.

Figure 10A:
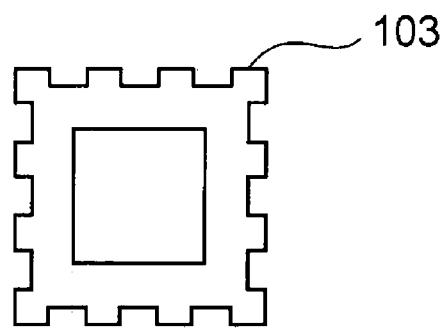
FIG. 10A, FIG. 10B, FIG. 10C, and FIG. 10D are diagrams showing modified examples of the intermediate substrate of the first embodiment.
Figure 10B:
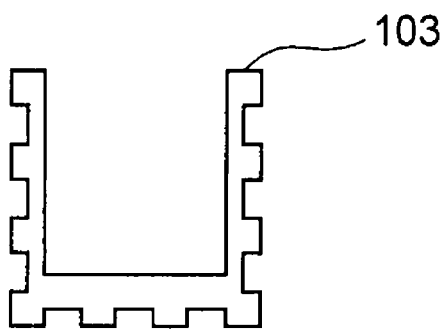
Figure 10C:
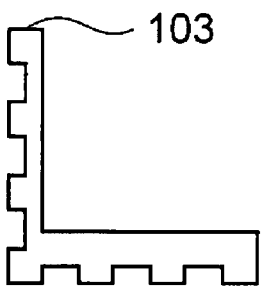
Figure 10D:
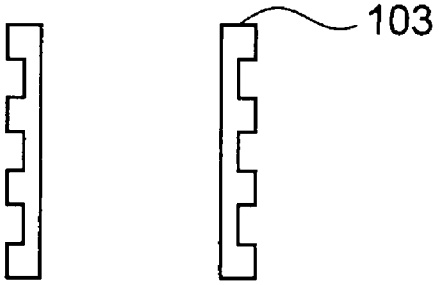

Each of FIG. 10A, FIG. 10B, FIG. 10C, and FIG. 10D shows an example of a shape of the intermediate substrate 103. The intermediate substrate 103, can be let to have a shape surrounded by a rectangular shape as shown in FIG. 10A, a shape of an English alphabet "U" as shown in FIG. 10B, a shape of an English alphabet "L" as shown in FIG. 10C, or a shape of two parallel plates as shown in FIG. 10D, when viewed from the top.

According to the second embodiment, it is possible to increase the joining area of the connecting terminal of the first substrate 101a and the intermediate substrate 103, and the second substrate 101b and the intermediate substrate 103. Therefore, it is possible to reduce the contact resistance. Consequently, it is possible to provide the stacked mounting structure 200 which is highly reliable electrically.

Moreover, it is possible to provide the stacked mounting structure 200 which is safe against an electrical short circuit. Particularly, it is effective when there is a reduction in the size of the stacked mounting structure 200, and when a pitch between the wires 105 of the intermediate substrate 103 is narrowed.

Furthermore, it is possible to accommodate the wire 105 formed on the side surface of the intermediate substrate 103, in the projected image (projected area) when the first substrate 101a and the second substrate 101b are viewed from the top.

Third Embodiment

Next, a stacked mounting structure 120 according to a third embodiment of the present invention will be described below. Same reference numerals are assigned to the components same as in the embodiments described above, and the description to be repeated is omitted.

Figure 11:
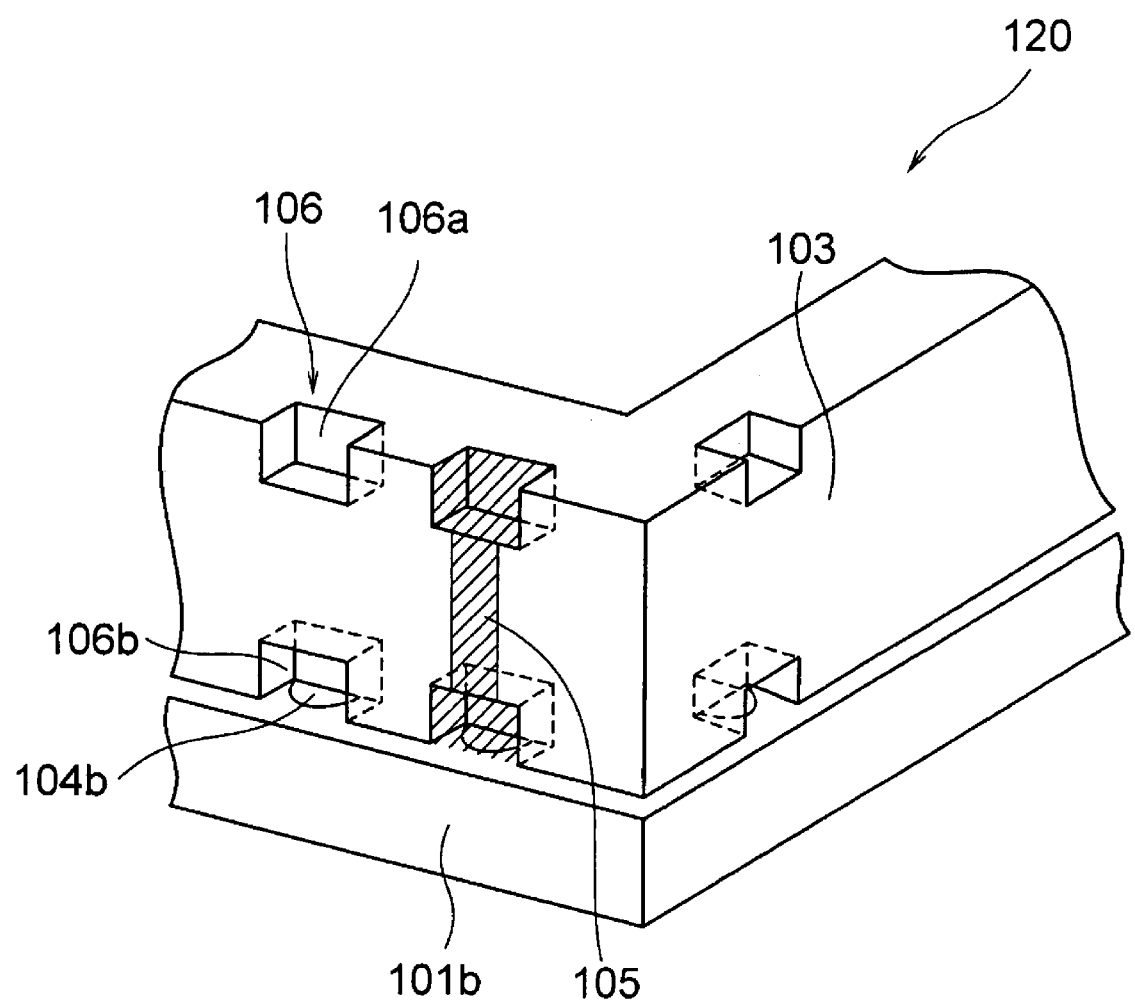
FIG. 11 is a diagram showing a perspective view of a stacked mounting structure according to a third embodiment.

FIG. 11 shows a schematic structure of the stacked mounting structure 120. The concave portion 106 formed in the intermediate substrate 103 includes a first concave portion 106a near the first substrate 101a and a second concave portion 106b near the second substrate 101b.

In this manner, the concave portion 106 formed in the intermediate substrate 103 is a groove structure with one end of the groove reaching the first substrate 101*a* (not shown in FIG. 11) and the other end of the groove reaching the second substrate 101*b*. Moreover, the structure is such that each of the first connecting terminal 104*a* (not shown in FIG. 11) of the first substrate 101*a* and the second connecting terminal 104*b* of the second substrate 101*b* is exposed.

According to the third embodiment, a concave portion is formed at least in a part of the side surface of the intermediate substrate 103. Therefore, the first connecting terminal 104*a* of the first substrate 101*a* and the second connecting terminal 104*b* of the second substrate 101*b* are exposed in the respective direction of principal plane.

Accordingly, it is possible to increase the joining area of the first substrate 101*a* and the intermediate substrate 103, and the second substrate 101*b* and the intermediate substrate 103.

Moreover, it is a groove structure in which, one end of the concave portion 106*a* formed in the intermediate substrate 103 reaches the first substrate 101*a*, and the other end of the concave portion 106*a* does not reach the second substrate 101*b*. Similarly, it is a groove structure in which, one end of the concave portion 106*b* formed in the intermediate substrate 103 reaches the second substrate 101*b*, and the other end of the concave portion 106*b* does not reach the first substrate 101*a*.

Therefore, it is possible to increase the mechanical strength of the intermediate substrate 103, as compared to a groove structure in which both ends of the concave portion reach the first substrate 101*a* and the second substrate 101*b*. Furthermore, at least a part of the side surface of the intermediate substrate 103 is formed to be on the inner side than the edge surface of each of the first substrate 101*a* and the second substrate 101*b* respectively.

Figure 14:
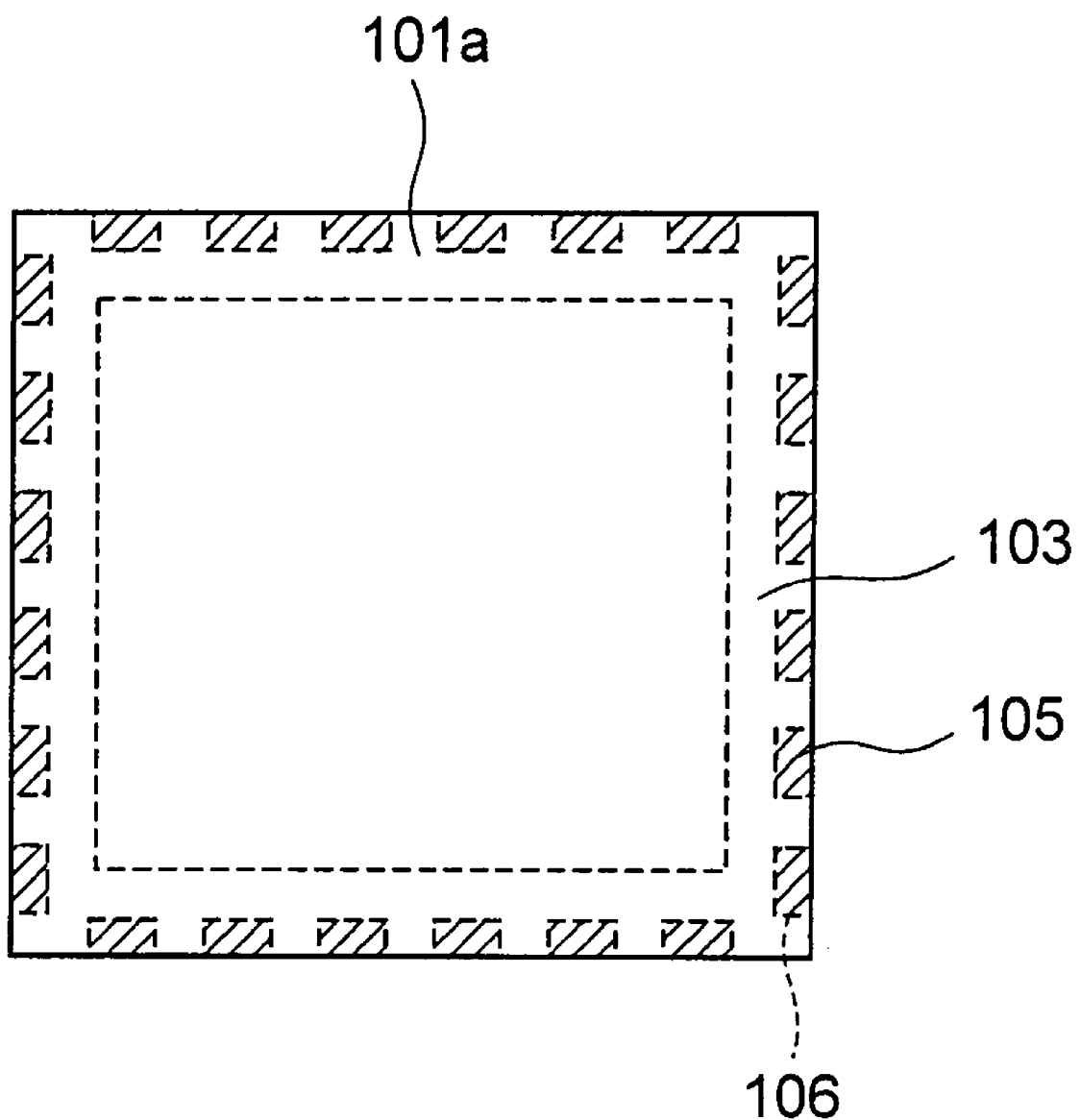
FIG. 14 is a diagram of an intermediate substrate of the third embodiment, as viewed from the top.

Therefore, the structure is such that the first connecting terminal 104*a* of the first substrate 101*a* and the second connecting terminal 104*b* provided on the second substrate 101*b* are exposed. Consequently, as shown in FIG. 14, it is possible to accommodate the wire 105 formed on the side surface of the intermediate substrate 103, in the projected image (projected area) of the first substrate 101*a* and the second substrate 101*b* when viewed from the top.

Figure 12:
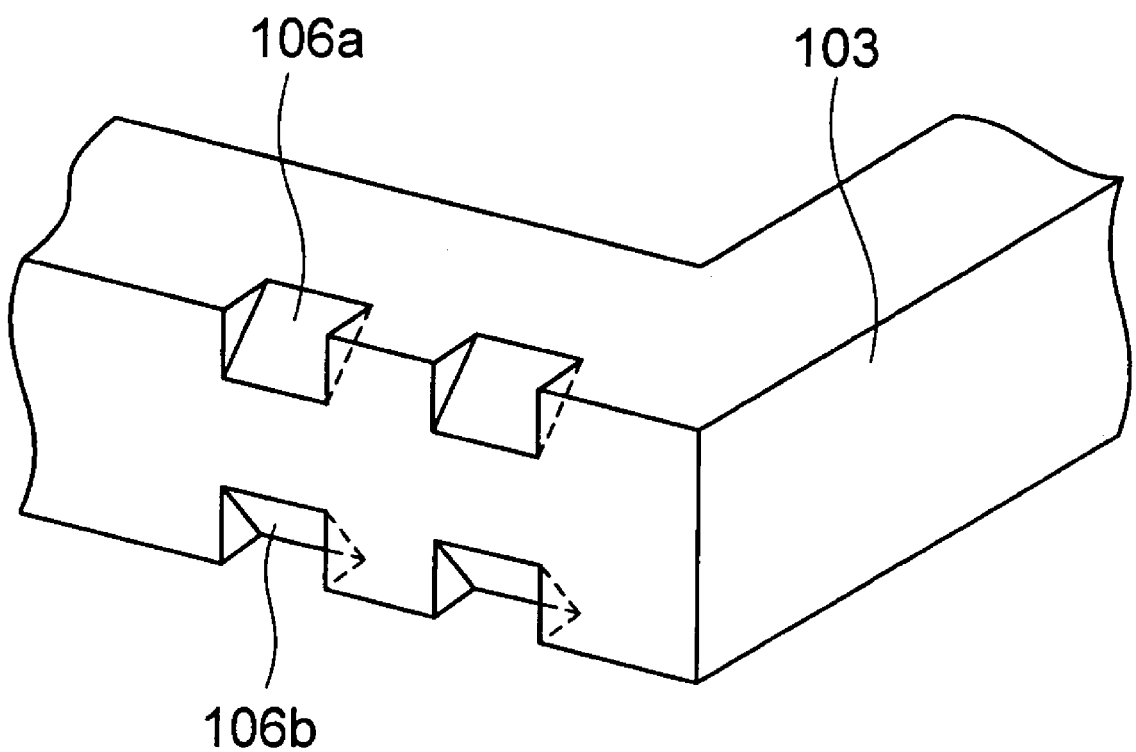
FIG. 12 is a diagram showing a perspective view of a stacked mounting structure according to a modified embodiment of the third embodiment.
Figure 13:
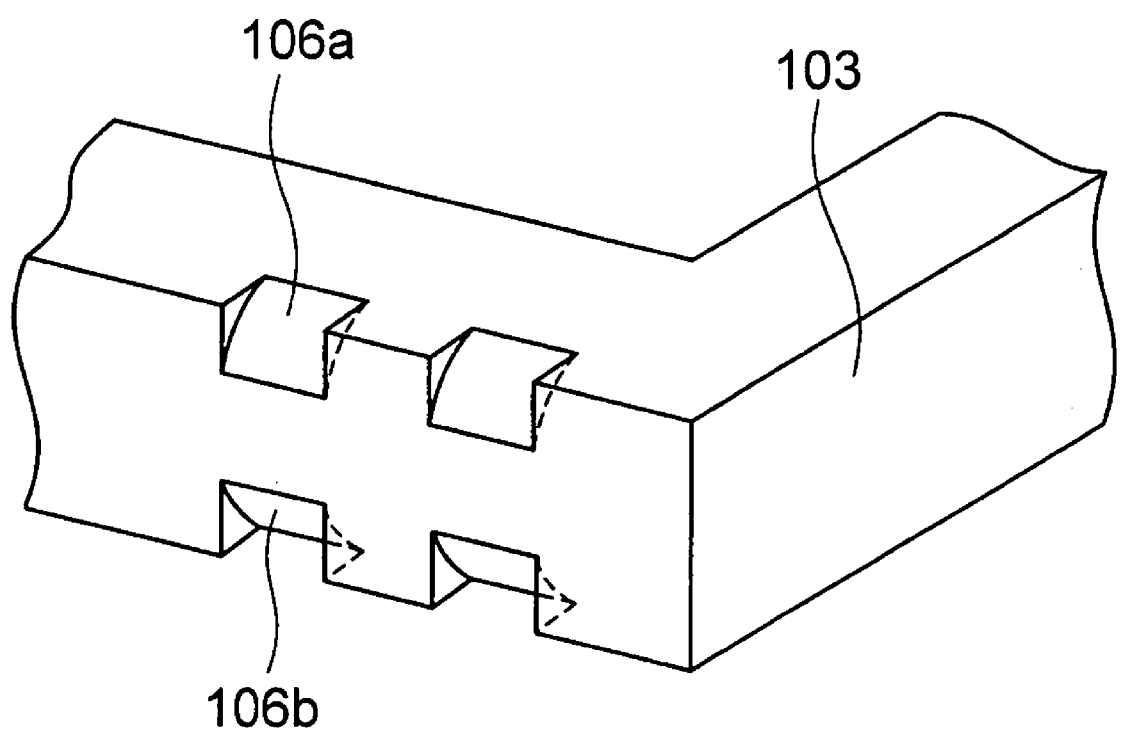
FIG. 13 is a diagram showing a perspective view of another stacked mounting structure according to another modified embodiment of the third embodiment.

Moreover, it is possible to form the shape of the concave portions 106*a* and 106*b* formed in the intermediate substrate 103, by an inclined surface as shown in FIG. 12 respectively. Furthermore, it is possible to form the shape of the concave portions 106*a* and 106*b* formed in the intermediate substrate 103, by a curved surface each having a curvature as shown in FIG. 13.

Figure 15A:
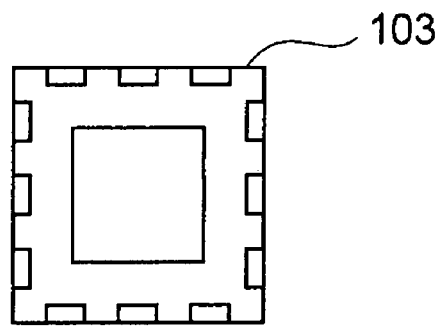
FIG. 15A, FIG. 15B, FIG. 15C, and FIG. 15D are diagrams showing modified examples of the intermediate substrate of the third embodiment.
Figure 15B:
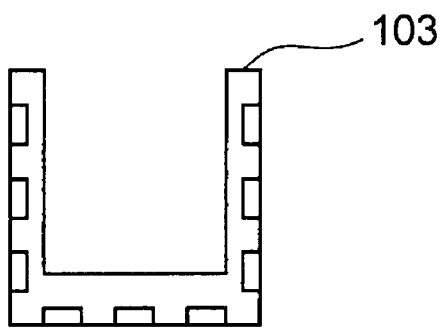
Figure 15C:
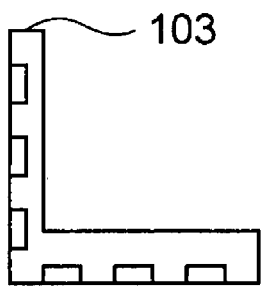
Figure 15D:
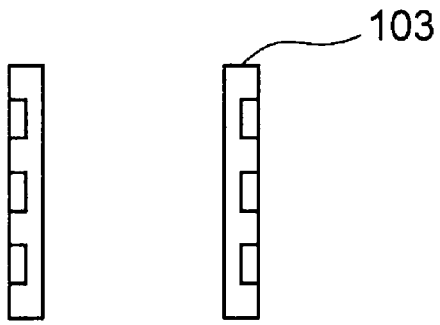

Each of FIG. 15A, FIG. 15B, FIG. 15C, and FIG. 15D shows an example of a shape of the intermediate substrate 103. The intermediate substrate 103 can be let to have a shape surrounded by a rectangular shape as shown in FIG. 15A, a shape of an English alphabet "U" as shown in FIG. 15B, a shape of an English alphabet "L" as shown in FIG. 15C, or a shape of two parallel plates as shown in FIG. 15D, when viewed from the top.

According to the third embodiment, it is possible to increase the joining area of the first substrate 101*a* and the intermediate substrate 103, and the second substrate 101*b* and the intermediate substrate 103. Therefore, it is possible to reduce the contact resistance. As a result of this, it is possible to provide a stacked mounting structure which is highly reliable electrically.

Moreover, the concave portions 106*a* and 106*b* are formed only in a part of the intermediate substrate 103. Therefore, it is possible to maintain the mechanical strength of the intermediate substrate 103. As a result of this, it is possible to ensure substantially a space which accommodates the components to be mounted 102*b*1, 102*b*2, and 102*b*3 on the inner side of the intermediate substrate 103. This is effective particularly when the size of the stacked mounting structure 120 is reduced.

Furthermore, as it has been mentioned above, it is possible to accommodate the wire 105 formed on the side surface of the intermediate substrate 103, in the projected image (projected area) when the first substrate 101*a* and the second substrate 101*b* are viewed from the top.

Fourth Embodiment

Next, a stacked mounting structure 130 according to a fourth embodiment of the present invention will be described below. Same reference numerals are assigned to components which are same as in the embodiments described above, and the description to be repeated is omitted.

Figure 16:
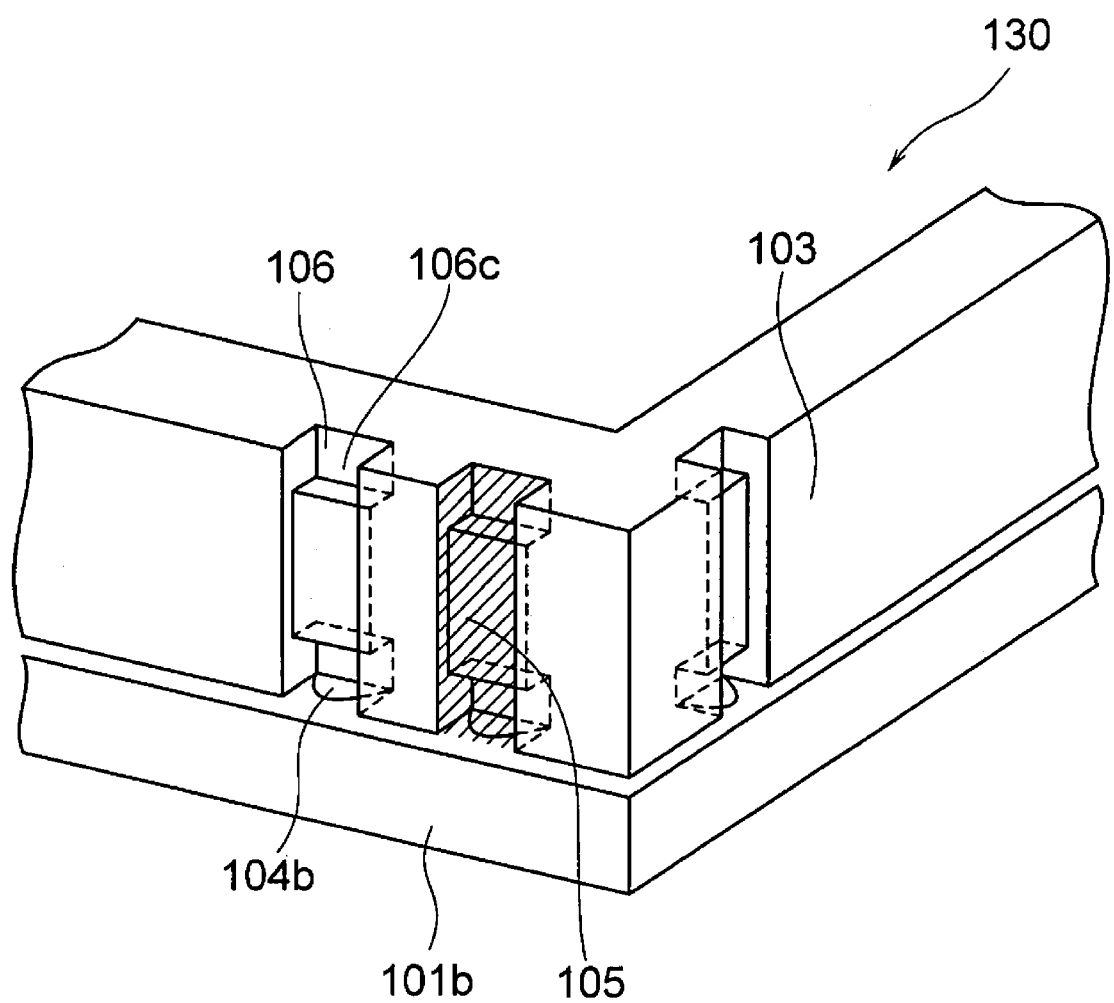
FIG. 16 is a diagram showing a perspective view of a stacked mounting structure according to a fourth embodiment.

FIG. 16 shows a schematic structure of the stacked mounting structure 130. The fourth embodiment differs at the following points compared with the second embodiment. The concave portion 106 formed in the intermediate substrate 103 has a groove structure in which one end of the concave portion 106 reaches the first substrate 101*a* (not shown in FIG. 16), and the other end of the concave portion 106 reaches the second connecting terminal 104*b* of the second substrate 101*b*. Moreover, the structure of the groove is such that a depth of a part of the groove 106*c* is more as compared to the depth of the other remaining part of the groove. Accordingly, the structure is such that the first connecting terminal 104*a* (not shown in FIG. 16) of the first substrate 101*a*, and the second connecting terminal 104*b* of the second substrate 101*b* are exposed.

According to the fourth embodiment, the concave portion 106 is formed in the side surface of the intermediate substrate 103. Therefore, the first connecting terminal 104*a* of the first substrate 101*a* and the second connecting terminal 104*b* of the second substrate 101*b* are exposed in the direction of the principal plane respectively. Accordingly, it is possible to increase the joining area of the first substrate 101*a* and the intermediate substrate 103, and the second substrate 101*b* and the intermediate substrate 103.

Moreover, the concave portion 106 is formed in the side surface of the intermediate substrate 103. Therefore, it is possible to prevent the adjacent wires 105 from interfering. Furthermore, the concave portion 106*c* which is deep is formed only in a part of the intermediate substrate 103. Therefore, it is possible to maintain the mechanical strength of the intermediate substrate 103.

Figure 19:
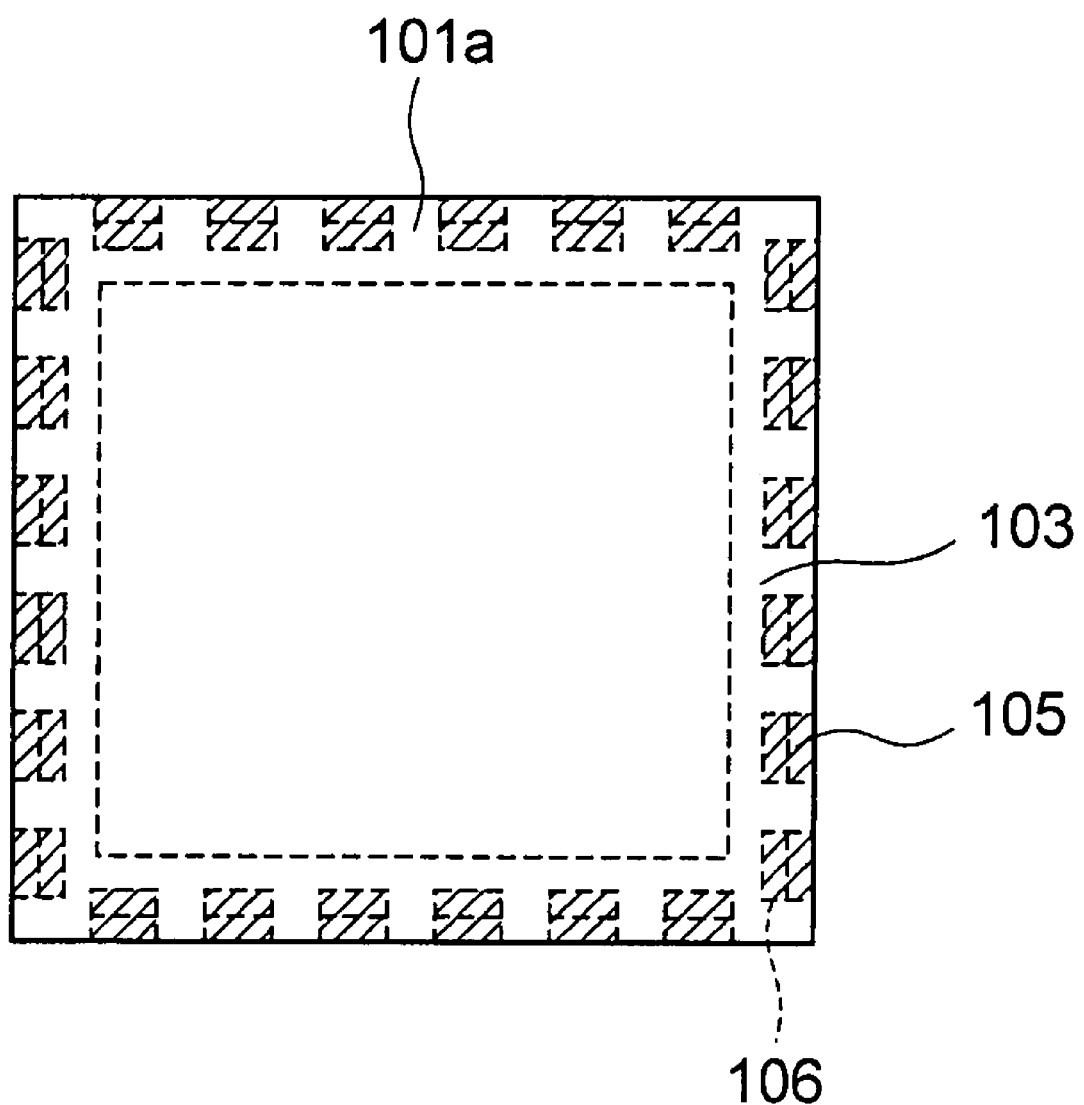
FIG. 19 is a diagram of a substrate of the fourth embodiment, as viewed from the top.

Further, at least a part of the side surface of the intermediate substrate 103 is formed to be on the inner side than the edge surface of each of the first substrate 101*a* and the second substrate 101*b*. Accordingly, the structure is such that the first connecting terminal 104*a* of the first substrate 101*a* and the second connecting terminal 104*b* provided on the second substrate 101*b* are exposed. As a result of this, as shown in FIG. 19, it is possible to accommodate the wire 105 formed on the side surface of the intermediate surface in the projected image of the first substrate 101*a* and the second substrate 101*b* from the top.

Figure 17:
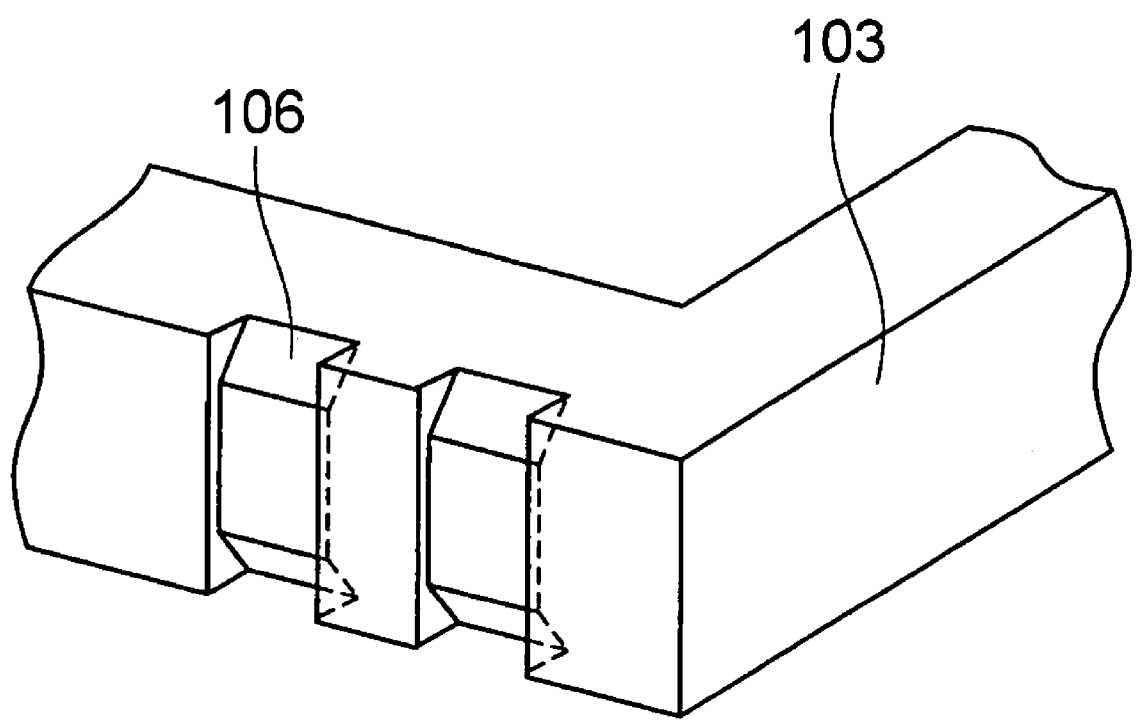
FIG. 17 is a diagram showing a perspective view of a stacked mounting structure according to a modified embodiment of the fourth embodiment.
Figure 18:
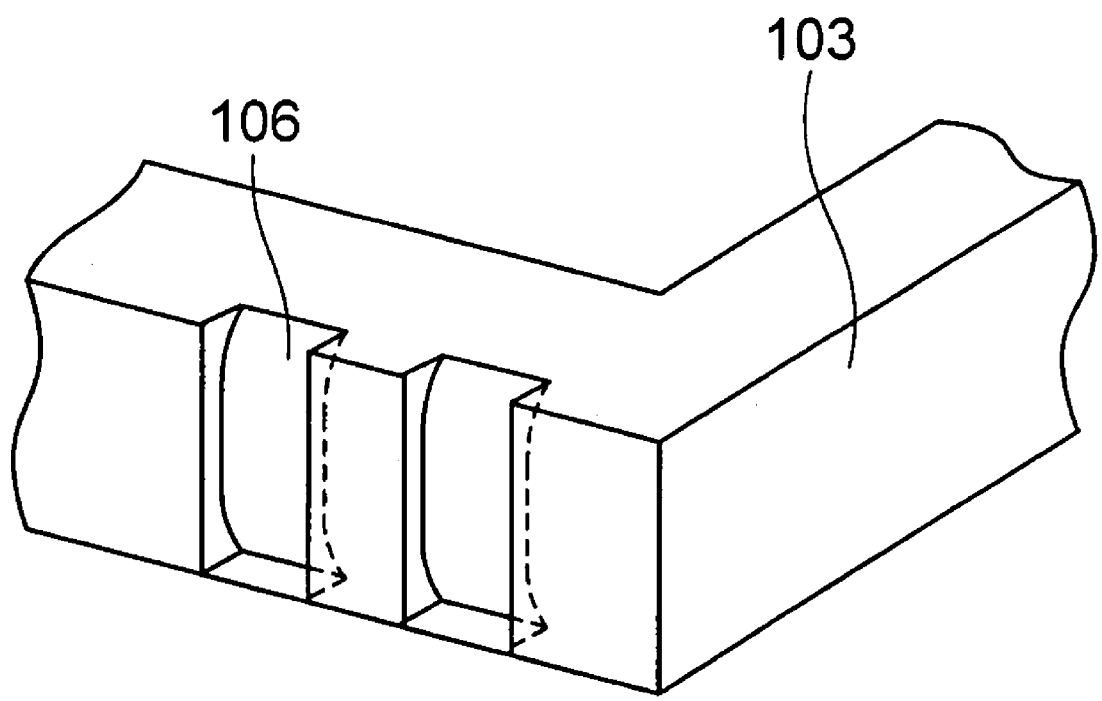
FIG. 18 is a diagram showing a perspective view of a stacked mounting structure according to another modified embodiment of the fourth embodiment.

Moreover, it is possible to form the shape of the concave portion 106 formed in the intermediate substrate 103 by an inclined surface and a parallel surface as shown in FIG. 17. It is also possible to form the shape of the concave portion formed in the intermediate substrate 103 by a curved surface having a curvature as shown in FIG. 18.

Figure 20A:
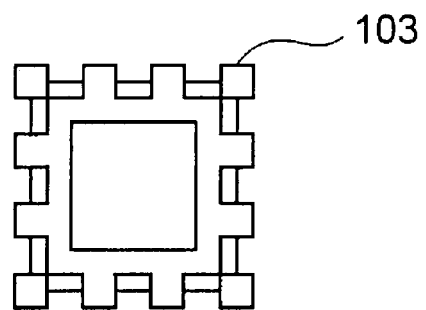
FIG. 20A, FIG. 20B, FIG. 20C, and FIG. 20D are diagrams showing modified examples of the intermediate substrate of the fourth embodiment.
Figure 20B:
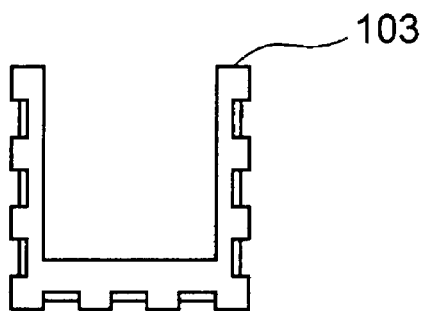
Figure 20C:
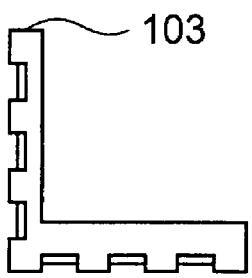
Figure 20D:
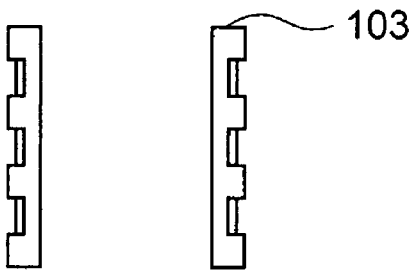

Each of FIG. 20A, FIG. 20B, FIG. 20C, and FIG. 20D shows an example of a shape of the intermediate substrate 103. The intermediate substrate 103 can be let to have a shape surrounded by a rectangular shape as shown in FIG. 20A, a shape of an English alphabet "U" as shown in FIG. 20B, a shape of an English alphabet "L" as shown in FIG. 20C, or a shape of two parallel plates as shown in FIG. 20D, when viewed from the top.

According to the fourth embodiment, it is possible to perform assuredly the joining of the first connecting terminal 104a and the second connecting terminal 104b provided between the substrates on which the components to be mounted 102b1, 102b2, and 102b3 are mounted. Moreover, it is possible to increase the joining area of the first substrate 101a and the intermediate substrate 103, and the second substrate 101b and the intermediate substrate 103. Therefore, it is possible to reduce the contact resistance.

It is possible to provide the stacked mounting structure which is safe against the electrical short circuit. Particularly, it is effective when there is a reduction in the size of the stacked mounting structure, and when a pitch of the intermediate substrate is narrowed.

Furthermore, the concave portion 106c which is deep is formed only in a part of the intermediate substrate 103. Therefore, it is possible to maintain the mechanical strength of the intermediate substrate 103. As a result of this, it is possible to ensure substantially a space which accommodates the components to be mounted 102b1, 102b2, and 102b3 on the inner side of the intermediate substrate 103. This is effective particularly when the size of the stacked mounting structure 130 is reduced.

Fifth Embodiment

Next, a stacked mounting structure 140 according to a fifth embodiment of the present invention will be described below. Same reference numerals are assigned to components which are same as in the embodiments described above, and the description to be repeated is omitted.

Figure 21A:
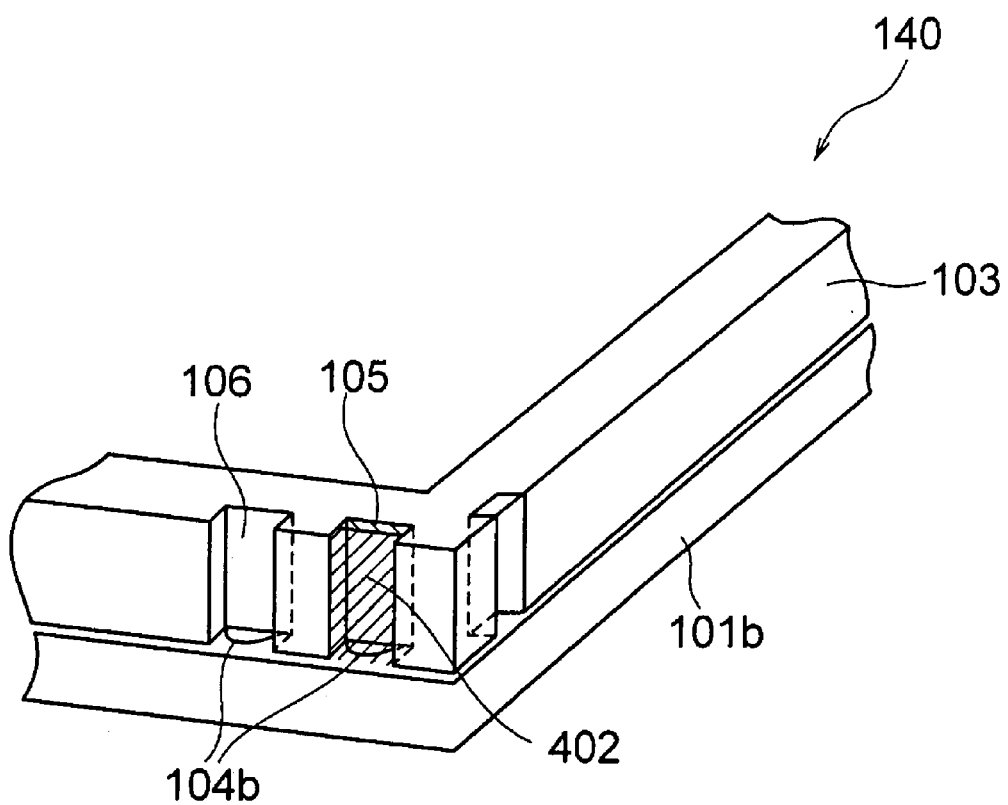
FIG. 21A is a diagram showing a perspective view of a stacked laminated structure according to a fifth embodiment.
Figure 21B:
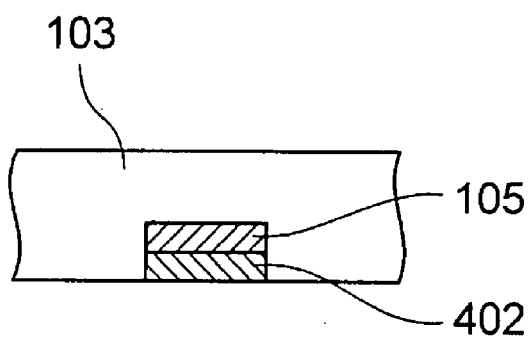
FIG. 21B is a diagram showing a cross-sectional view parallel to a principal plane (upper surface) of an intermediate substrate according to the fifth embodiment.

FIG. 21A shows a schematic structure of the stacked mounting structure 140, and FIG. 21B shows a cross-sectional view parallel to a principal plane (upper surface) of the intermediate substrate 103. The fifth embodiment differs at the following points compared with the embodiments described above. The concave portion 106 formed in the intermediate substrate 103 is filled with the wire 105 and an insulating material 402.

Figure 22A:
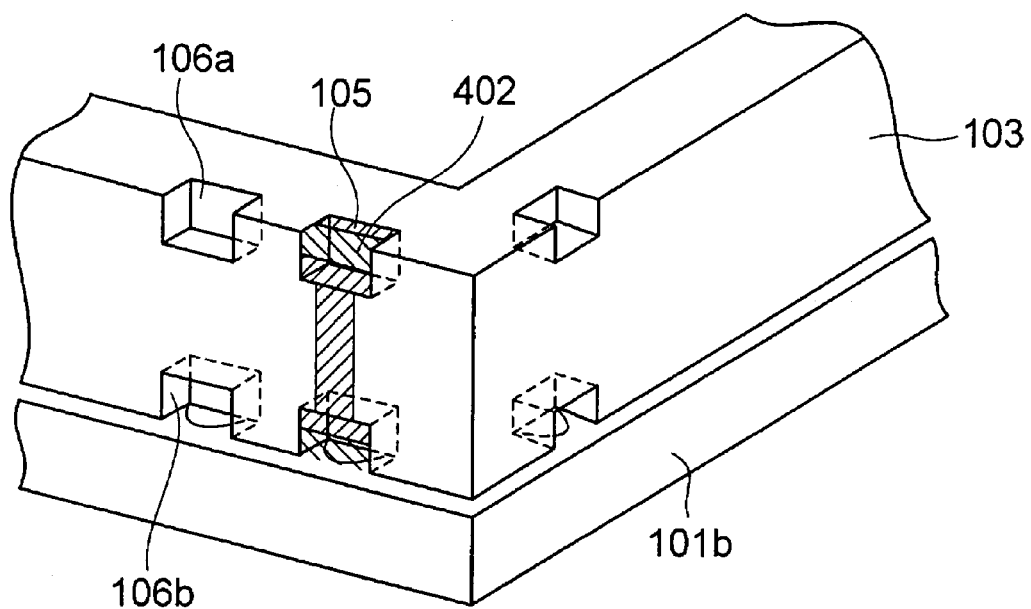
FIG. 22A is a diagram showing a perspective view of a stacked mounting surface according to a modified embodiment of the fifth embodiment.
Figure 22B:
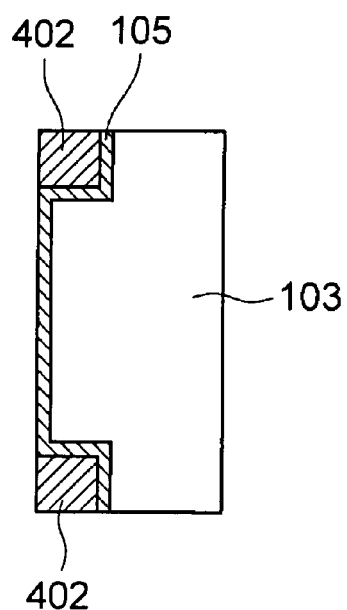
FIG. 22B is a diagram showing a cross-sectional view parallel to a side surface of an intermediate substrate according to the modified embodiment of the fifth embodiment.

Next, modified embodiments will be described below. FIG. 22A shows a schematic structure of a modified embodiment of the stacked mounting structure 140, and FIG. 22B shows a cross-sectional view parallel to the side surface of the intermediate substrate 103. The concave portion 106 formed in the intermediate substrate 103 is filled with the wire 105 and the insulating material 402.

Figure 23A:
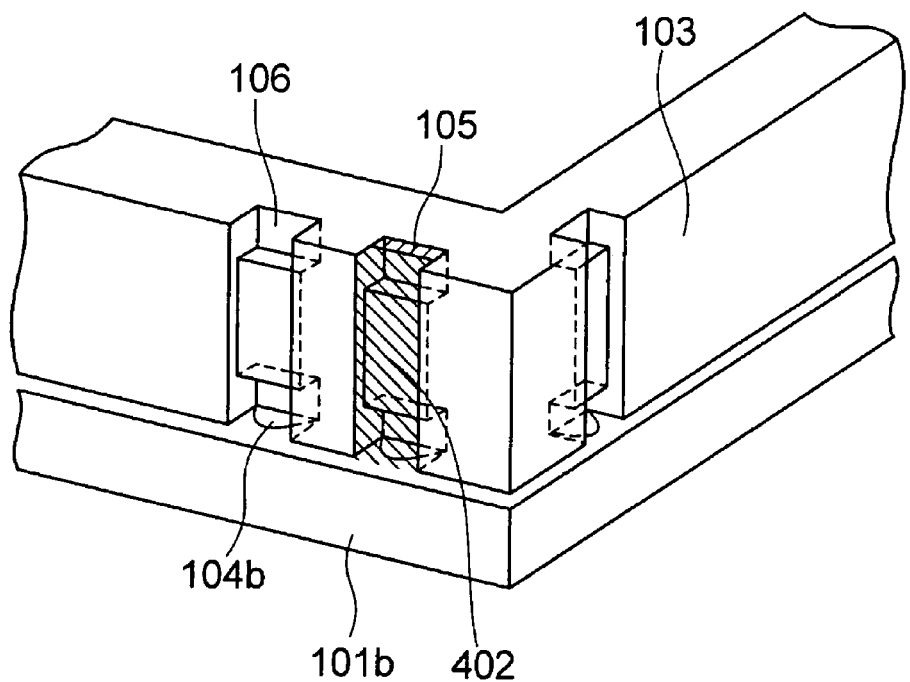
FIG. 23A is a diagram showing a perspective view of a stacked mounting surface according to another modified embodiment of the fifth embodiment.
Figure 23B:
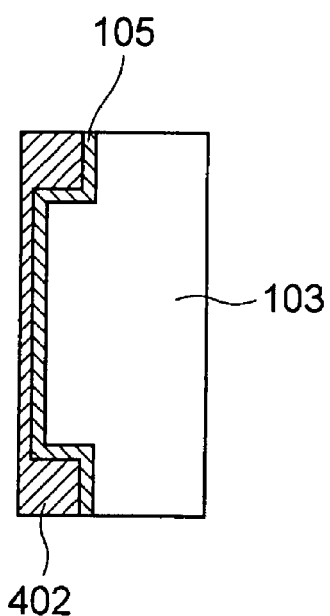
FIG. 23B is a diagram showing a cross-sectional view parallel a side surface of a substrate according to another modified embodiment of the fifth embodiment.
Figure 24:
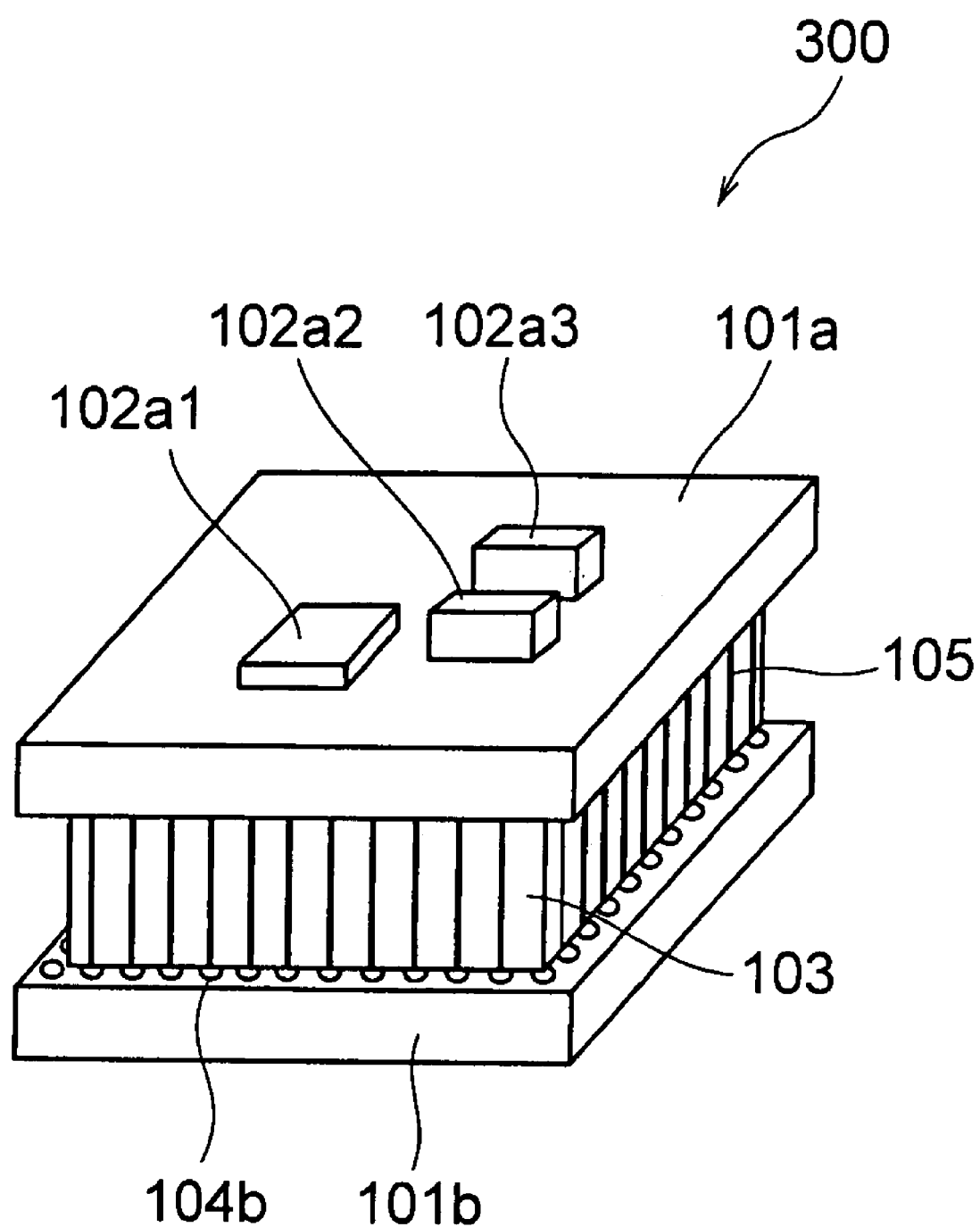
FIG. 24 is a diagram showing a perspective view of a stacked mounting structure according to a sixth embodiment.

Next, another modified embodiment will be described. FIG. 23A shows a schematic structure of another modified embodiment of the stacked mounting structure 140, and FIG. 23B shows a cross-sectional view parallel to the side surface of the intermediate substrate 103. The concave portion 106 formed in the intermediate substrate 103 is filled with the wire 105 and the insulating material 402.

According to the fifth embodiment, it is possible to protect electrically the wire 105 formed in the concave portion 106 by the insulating material 402. Accordingly, the wire 105 is protected by the insulating material 402. Therefore, it is possible to provide a stacked mounting structure which is safe electrically.

Sixth Embodiment

Next, a stacked mounting structure 300 according to a sixth embodiment of the present invention will be described below. Same reference numerals are assigned to components which are same as in the first embodiment, and the description to be repeated is omitted.

In the sixth embodiment, according to a pattern of the wire 105 formed on the side surface of the intermediate substrate 103, the structure is such that at least a part of the first connecting terminal 104a provided on a principal plane of the first substrate 101a is provided on a principal plane of the second substrate 101b, and the first connecting terminal 104a and second connecting terminal 104b which is the most close to and facing the first connecting terminal 104a are connected.

According to the sixth embodiment, it becomes easy to form the wire 105 on the side surface of the intermediate substrate 103. Accordingly, it is possible to provide the stacked mounting structure 300 which is low cost.

Seventh Embodiment

Figure 25:
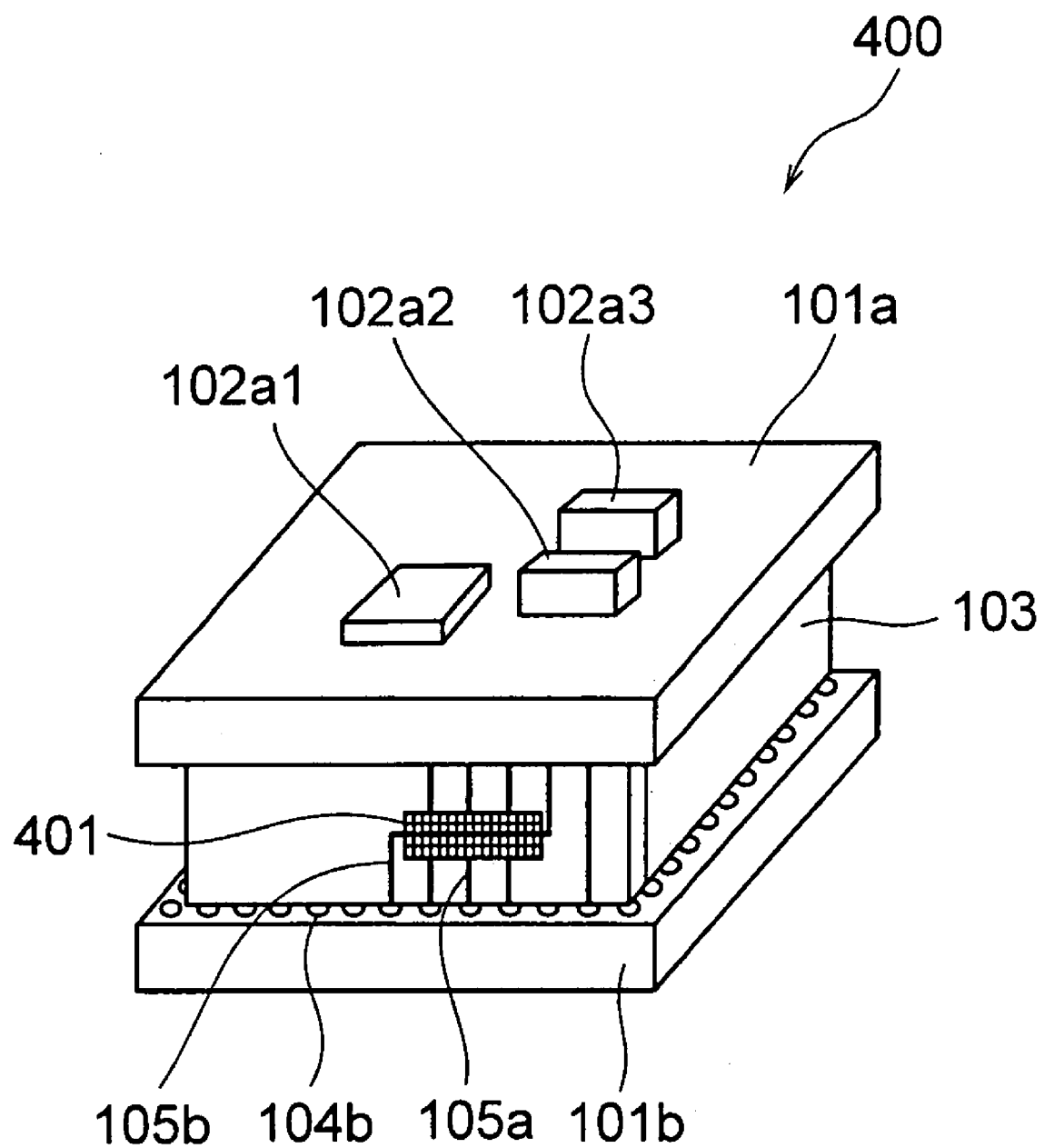
FIG. 25 is a diagram showing a perspective view of a stacked mounting structure according to a seventh embodiment.

Next, a stacked mounting structure 400 according to a seventh embodiment of the present invention will be described below. Same reference numerals are assigned to components which are same as in the first embodiment, and the description to be repeated is omitted. FIG. 25 shows a perspective view of the stacked mounting structure 400.

In the seventh embodiment, the wire 105 formed on the side surface of the intermediate substrate 103 includes a first wire pattern 105a and a second wire pattern 105b. The first wire pattern 105a corresponds to a first electroconductive portion. The second wire pattern 105b corresponds to a second electroconductive portion. Moreover, the first wire pattern 105a intersects with the second wire pattern 105b through an insulating material 401.

According to the seventh embodiment, it is possible to draw multiple wire patterns of the wire 105 formed on the intermediate substrate 103. Accordingly, it is possible to provide the stacked mounting structure 400 in which it is necessary to draw multiple wire patterns.

Eighth Embodiment

Next, a stacked mounting structure wafer 500 according an eighth embodiment of the present invention will be described below. Same reference numerals are assigned to components which are same as in the first embodiment, and the description to be repeated is omitted. Each of FIG. 26A, FIG. 26B, FIG. 26C, FIG. 26D, FIG. 26E, FIG. 27, and FIG. 28 shows a procedure for manufacturing the stacked mounting structure wafer 500.

Figure 26A:
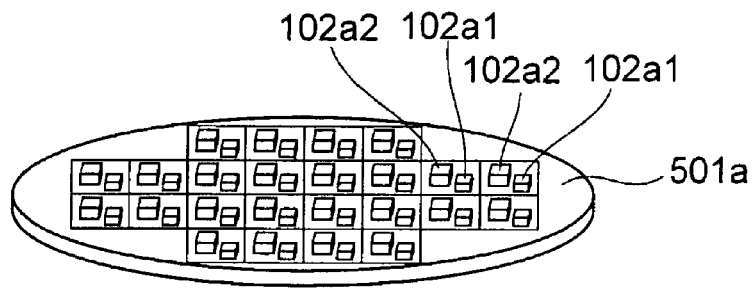
FIG. 26A, FIG. 26B, FIG. 26C, FIG. 26D, and FIG. 26E are diagrams showing a manufacturing procedure of a stacked mounting structure according to an eighth embodiment.
Figure 26B:
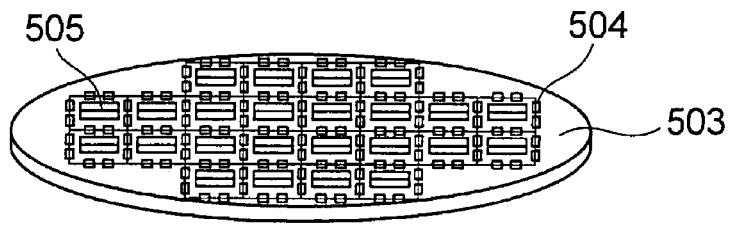
Figure 26C:
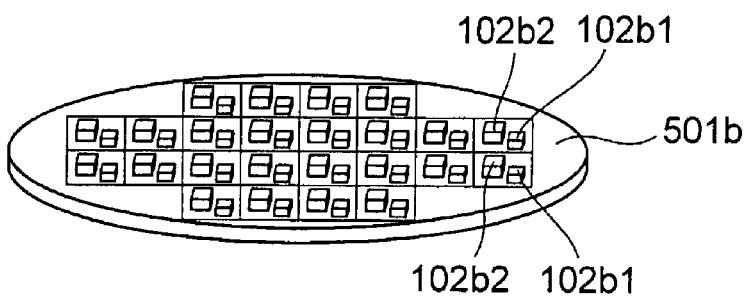

In a step of mounting on a first substrate shown in FIG. 26A, a plurality of devices 102a1 and 102a2 which are electronic components are mounted on a first wafer 501a. At a step of forming an intermediate substrate shown in FIG. 26B, a concave portion 504 and a cavity 505 for the intermediate substrate 103 are formed in an intermediate wafer 503. Further, at a step of mounting on a second substrate shown in FIG. 26C, a plurality of devices 102b1 and 102b2 which are electronic components, is mounted on a second wafer 501b. The first wafer 501a corresponds to a first substrate. The second wafer 501b corresponds to a second substrate. The intermediate wafer 503 corresponds to an intermediate substrate.

Figure 26D:
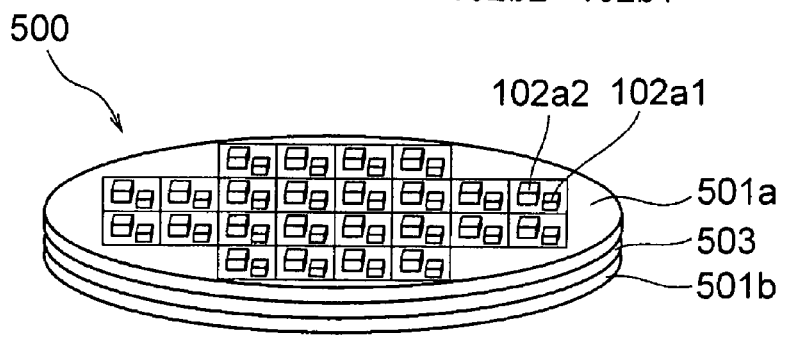

In a step of joining shown in FIG. 26D, the first wafer 501a, the intermediate wafer 503, and the second wafer 501b are stacked. FIG. 26D shows a perspective view of the stacked mounting structure 500 which is obtained by a step of sticking in which the first wafer 501a, the intermediate wafer 503, and the second wafer 501b are joined.

Figure 26E:
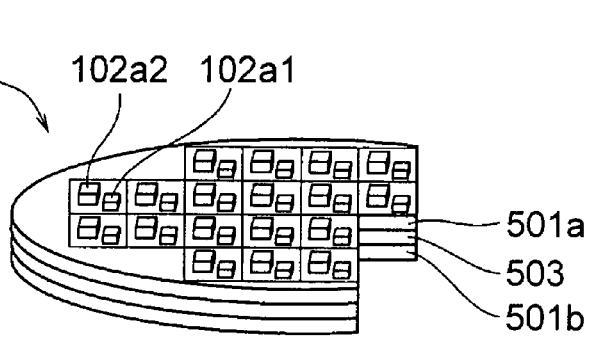
Figure 27:
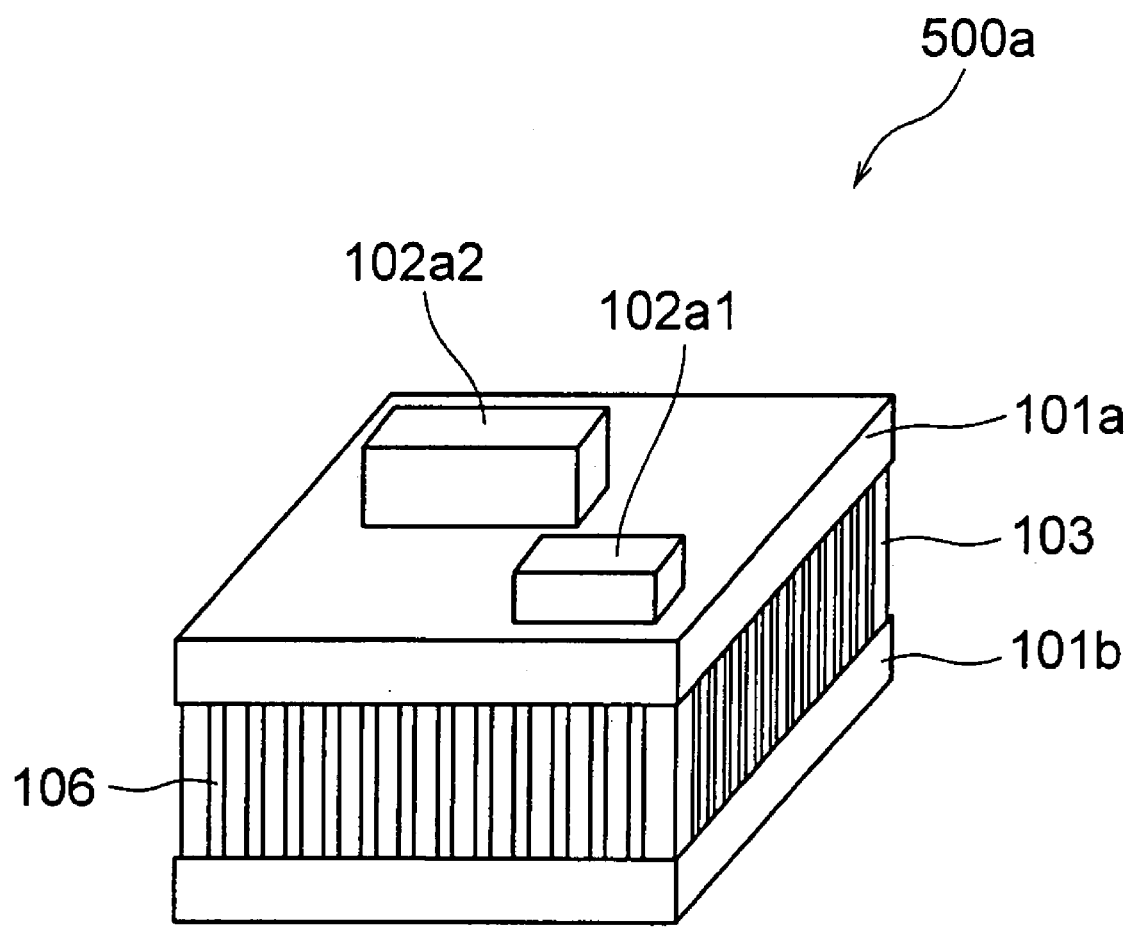
FIG. 27 is a diagram showing a perspective view of the stacked mounting structure according to the eighth embodiment.
Figure 28:
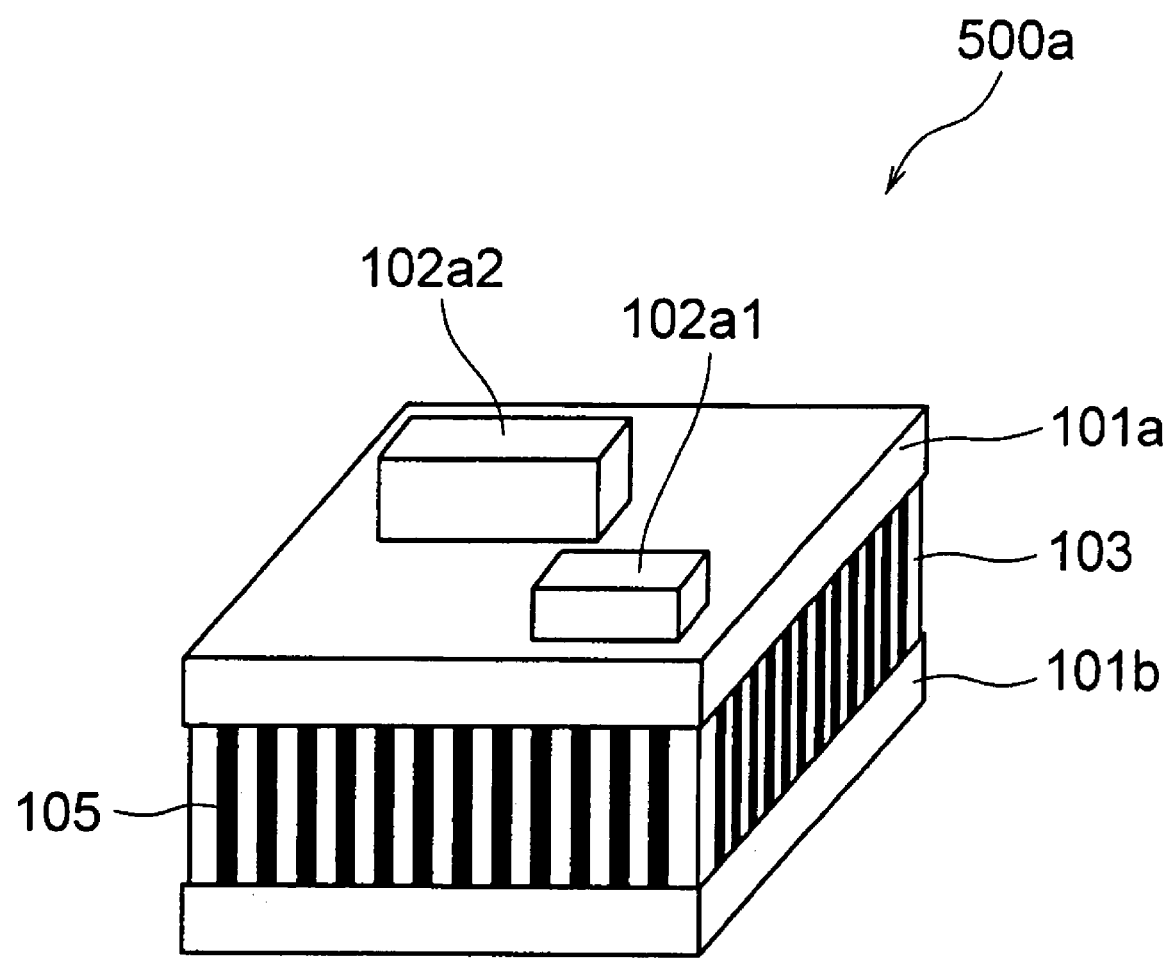
FIG. 28 is another diagram showing a perspective view of the stacked mounting structure according to the eighth embodiment.

In a step of cutting out shown in FIG. 26E, the stacked mounting structure wafer 500 is diced by a laser and a dicer etc. Accordingly, the stacked mounting structure 500 is cut out. FIG. 27 shows a perspective view of a stacked mounting structure 500a which is obtained by the step of cutting out the stacked mounting structure 500a by dicing the stacked mounting structure wafer 500 by the laser and the dicer etc.

Next, in a step of forming an electroconductive portion, a liquid which contains electroconductive particles is filled by the ink-jet method in the concave portion 106 in the intermediate substrate 103 of the stacked mounting structure 500a obtained by cutting out. Then, the stacked mounting structure 500a is inserted into a drying furnace. Accordingly, a dispersion medium is dried from the liquid which contains the electroconductive particles. As a result of this, by forming a layer made of the electroconductive particles, it is possible to join the first substrate 101a and the second substrate 101b.

According to the eighth embodiment, it is possible to produce collectively a plurality of stacked mounting structures 500a by using the wafers. Therefore, it is possible to provide the stacked mounting structure 500a which is low cost. Moreover, as it has been mentioned above, it is also possible to structure such that the pattern of the wire 105 formed on the side surface of the intermediate substrate 103 is formed by dripping by the ink-jet method. Accordingly, a three-dimensional pattern formation of the wire 105 becomes easy. As a result of this, it is possible to draw multiple wire patterns. Consequently, it is possible to provide a stacked mounting structure in which it is necessary to draw multiple wire patterns.

Ninth Embodiment

Figure 29:
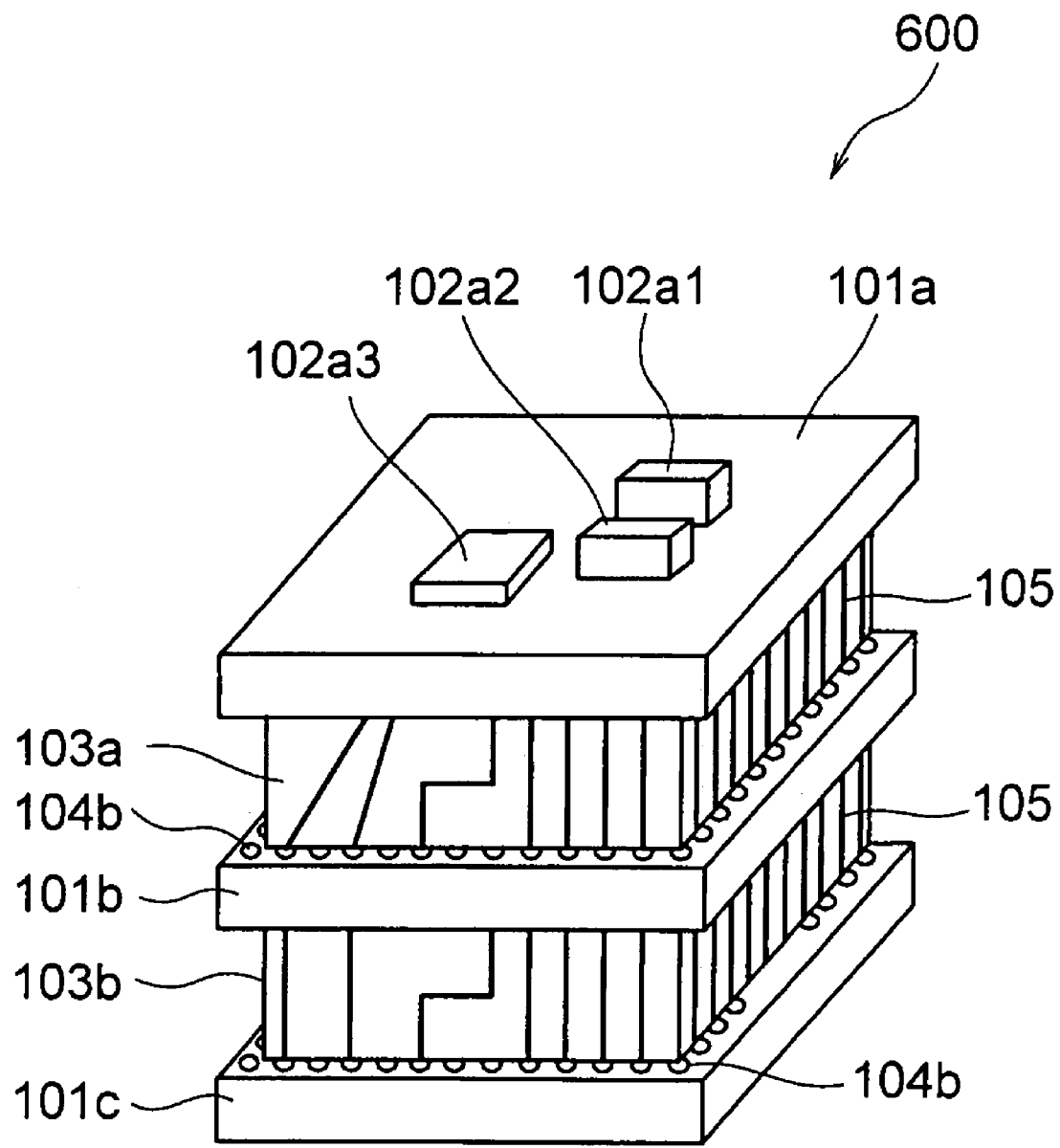
FIG. 29 is a diagram showing a perspective view of a stacked mounting structure according to a ninth embodiment.
Figure 30:
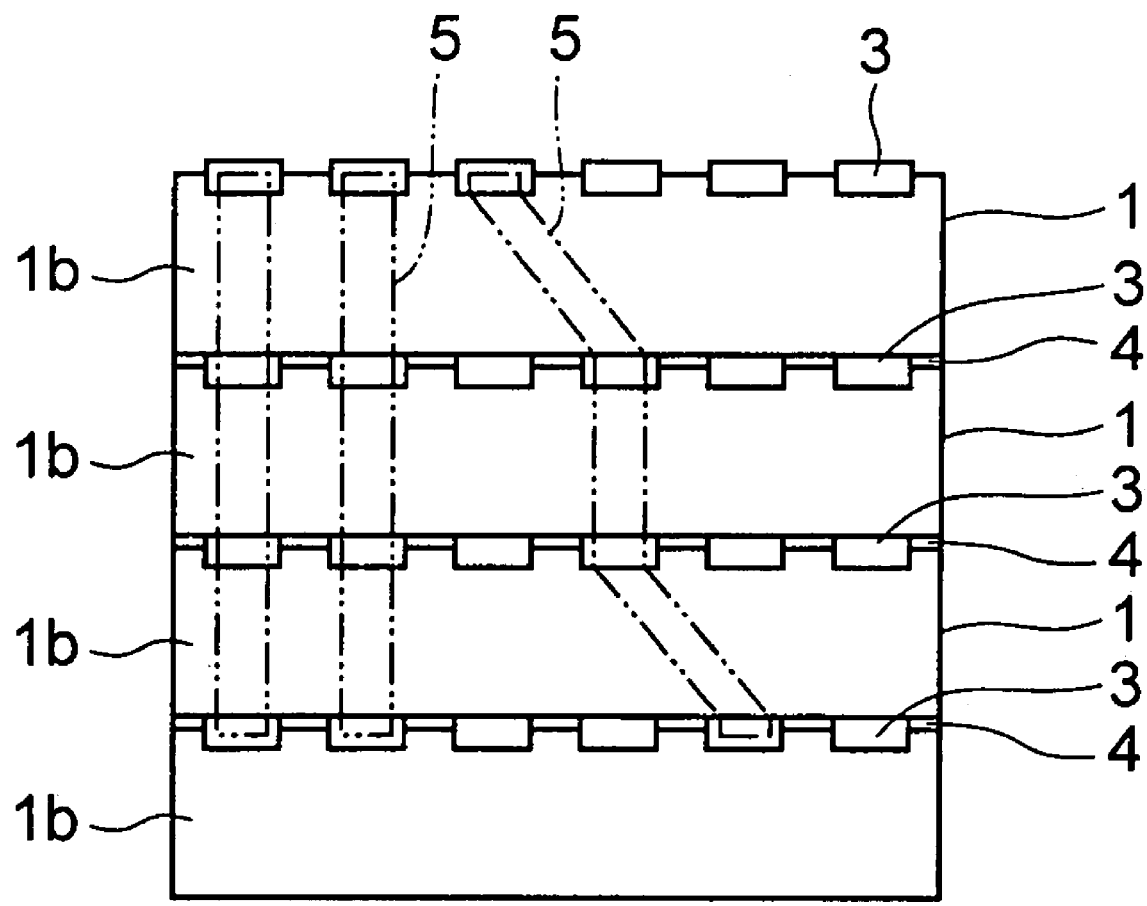
FIG. 30 is a diagram showing a schematic view of a stacked mounting structure according to a conventional technology.
Figure 31:
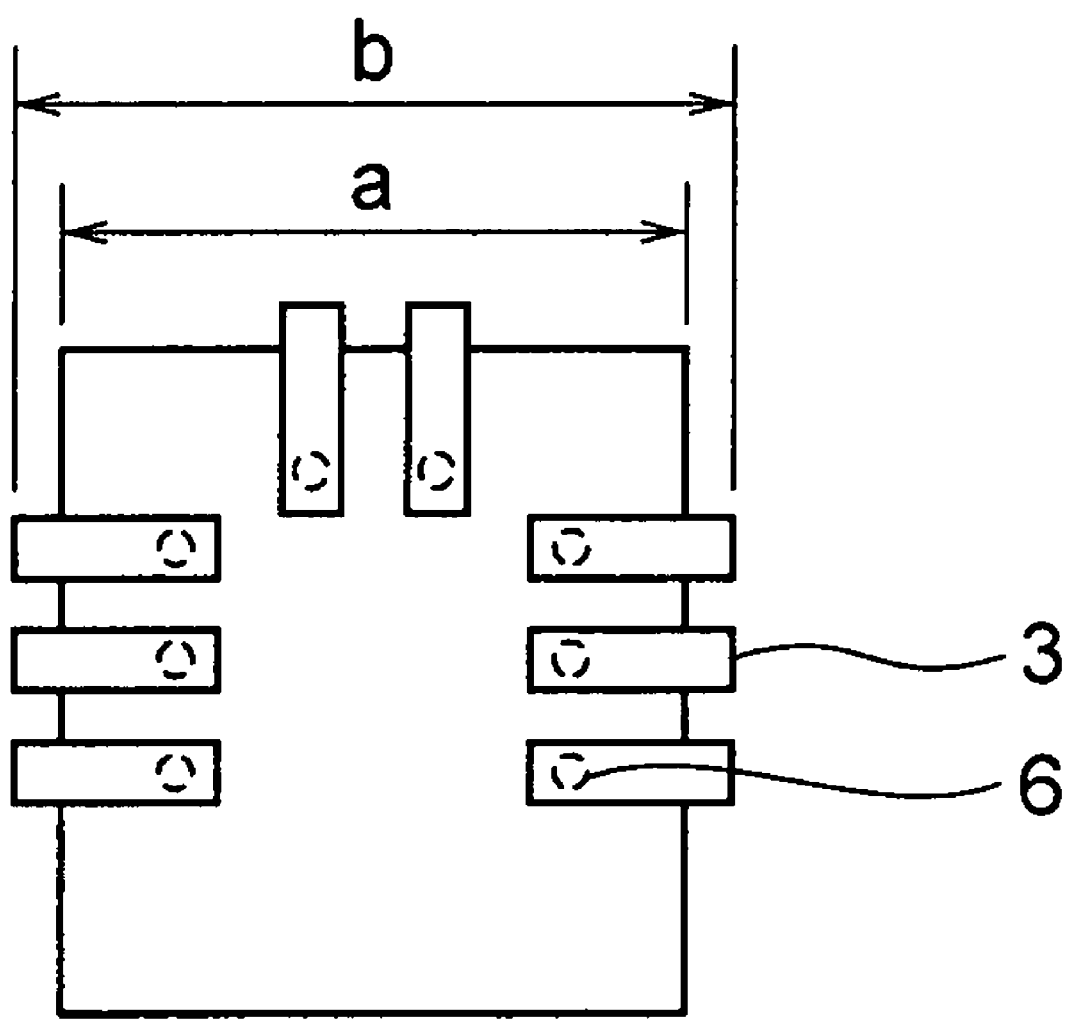
FIG. 31 is another diagram showing a schematic view of a stacked mounting structure according to the conventional technology.

FIG. 29 shows a perspective view of a stacked mounting structure 600 according to a ninth embodiment of the present invention. In each embodiment described above, an example of a stacked mounting structure which is formed by a two-layered substrate and a one-layered substrate is shown. However, the present invention is not restricted to this formation, and it may be a stacked mounting structure 600 of multiple stages.

In the ninth embodiment, the first substrate 101a and the second substrate 101b are joined through the intermediate substrate 103. Moreover, the second substrate 101b and a third substrate 101c are joined through an intermediate substrate 103b. Repeating the similar formation, it is possible to join further a fourth substrate, a fifth substrate and so on. Accordingly, it is possible to have the stacked mounting structure 600 of a plurality of stages.

The present invention can have various modifications which fall within the basic teachings herein set forth.

As it has been mentioned above, the stacked mounting structure according to the present invention enables to perform assuredly the joining of the terminals, and is useful in a small-size structure.

Moreover, according to the stacked mounting structure according to the present invention, it is possible to perform assuredly the joining of the terminals provided between members on which components to be mounted are mounted, and to make a size reduction.

What is claimed is:

1. A stacked mounting structure comprising:
at least first and second members, the first member having components mounted thereon and the second member is disposed facing the first member, and having other components mounted thereon; and
an intermediate member disposed between the first member and the second member, the intermediate member connecting the first member and the second member by leaving a predetermined gap between the first member and the second member, and which has a space which accommodates therein the components that are mounted, wherein
at least a pair of a first electrode and a second electrode is formed on the first member and the second member, respectively, and
further comprising:
an electroconductive portion which is formed on a surface of the intermediate member orthogonal to a surface on which the first electrode or the second electrode is formed, and which electrically connects the first electrode and the second electrode, wherein
a part of the first electrode and the second electrode are exposed by at least a part of the intermediate member being formed on an inner side than of an edge surface of the first member and an edge surface of the second member, and
one end of the electroconductive portion is connected to an exposed portion of the first electrode, and the other end of the electroconductive portion is connected to an exposed portion of the second electrode;
wherein each of the first electrode of the first member and the second electrode of the second member is exposed by formation of a concave portion in the surface of the intermediate member, orthogonal to the surface on which the first electrode or the second electrode is formed; the concave portion formed in the intermediate member includes a first concave portion near the first member and a second concave portion near the second member and the concave portion formed in the intermediate member is filled with the electroconductive portion and an insulating member.

2. A stacked mounting structure comprising:
at least first and second members, the first member having components mounted thereon and the second member is disposed facing the first member, and having other components mounted thereon; and
an intermediate member disposed between the first member and the second member, the intermediate member connecting the first member and the second member by leaving a predetermined gap between the first member and the second member, and which has a space which accommodates therein the components that are mounted wherein
at least a pair of a first electrode and a second electrode is formed on the first member and the second member, respectively, and
further comprising:
an electroconductive portion which is formed on a surface of the intermediate member orthogonal to a surface on which the first electrode or the second electrode is formed, and which electrically connects the first electrode and the second electrode, wherein
a part of the first electrode and the second electrode are exposed by at least a part of the intermediate member being formed on an inner side than of an edge surface of the first member and an edge surface of the second member, and one end of the electroconductive portion is connected to an exposed portion of the first electrode, and the other end of the electroconductive portion is connected to an exposed portion of the second electrode;

wherein each of the first electrode of the first member and the second electrode of the second member is exposed by formation of a concave portion in the surface of the intermediate member, orthogonal to the surface on which the first electrode or the second electrode is formed; the concave portion formed in the intermediate member has a structure such that one end reaches the first member and the other end reaches the second member, and at least a groove depth of a part of the groove concave portion structure is more than a groove depth of the remaining portion of the concave portion.

3. The stacked mounting structure according to claim 2, wherein the concave portion formed in the intermediate member is filled with the electroconductive portion and an insulating member.

4. A stacked mounting structure comprising:

at least first and second members, the first member having components mounted thereon and the second member is disposed facing the first member, and having other components mounted thereon; and an intermediate member disposed between the first member and the second member, the intermediate member connecting the first member and the second member by leaving a predetermined gap between the first member and the second member, and which has a space which accommodates therein the components that are mounted, wherein at least a pair of a first electrode and a second electrode is formed on the first member and the second member, respectively, and further comprising:

an electroconductive portion which is formed on a surface of the intermediate member orthogonal to a surface on which the first electrode or the second electrode is formed, and which electrically connects the first electrode and the second electrode, wherein a part of the first electrode and the second electrode are exposed by at least a part of the intermediate member being formed on an inner side than of an edge surface of the first member and an edge surface of the second member, and one end of the electroconductive portion is connected to an exposed portion of the first electrode, and the other end of the electroconductive portion is connected to an exposed portion of the second electrode;

wherein each of the first electrode of the first member and the second electrode of the second member is exposed by formation of a concave portion in the surface of the intermediate member, the concave portion formed in the intermediate member is filled with the electroconductive portion and an insulating member.

5. A stacked mounting structure comprising:

at least first and second members, the first member having components mounted thereon and the second member is disposed facing the first member, and having other components mounted thereon; and an intermediate member disposed between the first member and the second member, the intermediate member connecting the first member and the second member by leaving a predetermined gap between the first member and the second member, and which has a space which accommodates therein the components that are mounted, wherein at least a pair of a first electrode and a second electrode is formed on the first member and the second member, respectively, and further comprising:

an electroconductive portion which is formed on a surface of the intermediate member orthogonal to a surface on which the first electrode or the second electrode is formed, and which electrically connects the first electrode and the second electrode, wherein a part of the first electrode and the second electrode are exposed by at least a part of the intermediate member being formed on an inner side than of an edge surface of the first member and an edge surface of the second member, and one end of the electroconductive portion is connected to an exposed portion of the first electrode, and the other end of the electroconductive portion is connected to an exposed portion of the second electrode;

wherein the electroconductive portion of the intermediate member includes an insulating portion, and at least a first electroconductive portion and a second electroconductive portion, and at least a part of the first electroconductive portion intersects the second electroconductive portion via the insulating portion.

* * * * *